United States Patent
Araki

(10) Patent No.: US 11,751,484 B2
(45) Date of Patent: *Sep. 5, 2023

(54) MAGNETIC TUNNEL JUNCTION DEVICES INCLUDING A FREE MAGNETIC TRENCH LAYER AND A PLANAR REFERENCE MAGNETIC LAYER

(71) Applicant: Integrated Silicon Solution, (Cayman) Inc., Grand Cayman (KY)

(72) Inventor: Satoru Araki, San Jose, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 78 days.

This patent is subject to a terminal disclaimer.

(21) Appl. No.: 17/403,733

(22) Filed: Aug. 16, 2021

(65) Prior Publication Data

US 2022/0028929 A1 Jan. 27, 2022

Related U.S. Application Data

(63) Continuation of application No. 16/121,453, filed on Sep. 4, 2018, now Pat. No. 11,107,974, which is a
(Continued)

(51) Int. Cl.
*H10N 50/10* (2023.01)
*H10N 50/80* (2023.01)
(Continued)

(52) U.S. Cl.
CPC ........... *H10N 50/80* (2023.02); *G11C 11/161* (2013.01); *G11C 11/1659* (2013.01); *H01F 10/329* (2013.01); *H01F 10/3259* (2013.01);
*H01L 21/8221* (2013.01); *H10B 61/22* (2023.02); *H10N 50/01* (2023.02); *H10N 50/10* (2023.02);
(Continued)

(58) Field of Classification Search
CPC ......... H01L 43/02; H01L 43/08; H01L 43/12; H01L 27/222–228; H01L 25/0657; G11C 11/155; G11C 11/161; G11C 2211/5615; H01F 10/3259; H01F 10/329; H10B 61/10; H10B 61/20; H10B 61/22; H10N 50/00; H10N 50/01; H10N 50/10; H10N 50/20; H10N 59/00
See application file for complete search history.

(56) References Cited

U.S. PATENT DOCUMENTS 9,525,126 B1 * 12/2016 Lin .......................... H01L 43/12
9,564,587 B1 * 2/2017 Jo .......................... H01L 27/249
(Continued)

*Primary Examiner* — Yu Chen

(57) ABSTRACT

A Magnetic Tunnel Junction (MTJ) device can include a reference magnetic layer having one or more trenches disposed therein. One or more sections of a tunnel barrier layer can be disposed on the walls of the one or more trenches. One or more sections of a free magnetic layer can be disposed on the one or more sections of the tunnel barrier layer in the one or more trenches. One or more sections of a conductive layer can be disposed on the one or more sections of the free magnetic layer in the one or more trenches. One or more insulator blocks can be disposed between corresponding sections of the tunnel barrier layer, corresponding sections of the free magnetic layer and corresponding sections of the conductive layer in the one or more trenches.

15 Claims, 25 Drawing Sheets

Related U.S. Application Data continuation-in-part of application No. 16/059,004, filed on Aug. 8, 2018, now abandoned, which is a continuation-in-part of application No. 16/059,009, filed on Aug. 8, 2018, now abandoned, which is a continuation-in-part of application No. 16/059,012, filed on Aug. 8, 2018, now Pat. No. 10,734,573, which is a continuation-in-part of application No. 16/059,016, filed on Aug. 8, 2018, now Pat. No. 10,529,915, which is a continuation-in-part of application No. 16/059,018, filed on Aug. 8, 2018, now abandoned.

(60) Provisional application No. 62/647,210, filed on Mar. 23, 2018.

(51) Int. Cl.
*G11C 11/16* (2006.01)
*H01L 21/822* (2006.01)
*H01F 10/32* (2006.01)
*H10B 61/00* (2023.01)
*H10N 50/01* (2023.01)
*H10N 50/85* (2023.01)

(52) U.S. Cl.
CPC .......... *H10N 50/85* (2023.02); *G11C 11/1657* (2013.01); *G11C 11/1673* (2013.01); *H01F 10/3286* (2013.01)

(56) References Cited

U.S. PATENT DOCUMENTS

| | | | |
|---|---|---|---|
| 10,784,437 B2 * | 9/2020 | Araki | ............ H01L 43/10 |
| 11,107,974 B2 * | 8/2021 | Araki | ............ H01L 43/08 |
| 11,107,978 B2 * | 8/2021 | Araki | ............ G11C 11/161 |
| 2009/0218645 A1 * | 9/2009 | Ran | ............ G11C 11/5607 |
| | | | 257/E29.323 |
| 2017/0141157 A1 * | 5/2017 | Sakai | ............ H01L 27/226 |

* cited by examiner

1335
FORMING ONE OR MORE INSULATOR BLOCKS BETWEEN THE ONE OR MORE PORTIONS OF THE OPTIONAL NON-MAGNETIC LAYER, ONE OR MORE PORTIONS OF THE FREE MAGNETIC LAYER AND OPTIONALLY THE ONE OR MORE PORTIONS OF THE TUNNEL INSULATOR IN THE ONE OR MORE TRENCHES

1340
FORMING ONE OR MORE CONDUCTIVE CORES BETWEEN THE ONE OR MORE INSULATOR BLOCKS, AND BETWEEN THE FREE MAGNETIC LAYER, OR THE OPTIONAL NON-MAGNETIC LAYER IF APPLICABLE, IN THE ONE OR MORE TRENCHES

FIG. 13B

MAGNETIC TUNNEL JUNCTION DEVICES INCLUDING A FREE MAGNETIC TRENCH LAYER AND A PLANAR REFERENCE MAGNETIC LAYER

CROSS-REFERENCE TO RELATED APPLICATIONS

This is a continuation of U.S. patent application Ser. No. 16/121,453 filed Sep. 4, 2018, now U.S. Pat. No. 11,107,974, issued Aug. 31, 2021, is a continuation-in-part of U.S. patent application Ser. No. 16/059,004 filed Aug. 8, 2018, U.S. patent application Ser. No. 16/059,009 filed Aug. 8, 2018, U.S. patent application Ser. No. 16/059,012 filed Aug. 8, 2018, U.S. patent application Ser. No. 16/059,016 filed Aug. 8, 2018, U.S. patent application Ser. No. 16/059,018 filed Aug. 8, 2018; and claims the benefit of U.S. Provisional Patent Application No. 62/647,210 filed Mar. 23, 2018; all of which are incorporated herein in their entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, Internet of Things (IoT) devices, Artificial Intelligence (AI), and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). Referring to FIG. 1, a MTJ, in accordance with the convention art, is shown. The MTJ can include two magnetic layers 110, 120, and a magnetic tunnel barrier layer 130. One of the magnetic layers 110 can have a fixed magnetization polarization 140, while the polarization of the magnetization of the other magnetic layer 120 can switch between opposite directions. Typically, if the magnetic layers 110, 120 have the same magnetization polarization, the MTJ cell will exhibit a relatively low resistance value corresponding to a '1' bit state; while if the magnetization polarization between the two magnetic layers 110, 120 is antiparallel the MTJ cell will exhibit a relatively high resistance value corresponding to a '0' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM devices and methods of manufacture thereof.

SUMMARY OF THE INVENTION

The present technology may best be understood by referring to the following description and accompanying drawings that are used to illustrate embodiments of the present technology directed toward Magnetic Tunnel Junction (MTJ) devices.

In one embodiment, device can include a reference magnetic layer having a plurality of trenches disposed therein. One or more sections of a tunnel barrier layer can be disposed on the walls of the plurality of trenches. One or more sections of a free magnetic layer can be disposed on the one or more sections of the tunnel barrier layer in the plurality of trenches. One or more sections of a conductive layer can be disposed on the one or more sections of the free magnetic layer in the plurality of trenches. A plurality of insulator blocks arranged can be disposed between corresponding sections of the tunnel barrier layer, corresponding sections of the free magnetic layer and corresponding sections of the conductive layer in an array of columns and rows in the plurality of trenches. Corresponding sections of the tunnel barrier layer, corresponding section of the free magnetic layer and corresponding sections of the conductive layer disposed between adjacent insulator blocks in one of the plurality of trenches form a Magnetic Tunnel Junction (MTJ) cell.

In another embodiment, a memory device can include an array of Magnetic Tunnel Junction (MTJ) cells. The array of MTJ cells can include a reference magnetic layer including a plurality of trenches. One or more sections of a tunnel barrier layer can be disposed on the walls of the plurality of trenches. One or more sections of a free magnetic layer can be disposed on the one or more sections of the tunnel barrier layer in the plurality of trenches. One or more sections of a conductive layer can be disposed on the one or more sections of the free magnetic layer in the plurality of trenches. A plurality of insulator blocks arranged can be disposed between corresponding sections of the tunnel barrier layer, corresponding sections of the free magnetic layer and corresponding sections of the conductive layer in an array of columns and rows in the plurality of trenches. A bit line can be coupled to the reference magnetic layer. A plurality of select transistors can be coupled to respective sections of the conductive layer in the plurality of trenches.

In yet another embodiment, a device can include a first reference magnetic layer including a first plurality of trenches, and a second reference magnetic layer including a second plurality of trenches. A plurality of sections of a first tunnel barrier layer can be disposed on the walls of the first plurality of trenches. A plurality of sections of a first free magnetic layer can be disposed on the plurality of sections of the first tunnel barrier layer in the first plurality of trenches. A plurality of sections of a first conductive layer can be disposed on the plurality of sections of the first free magnetic layer in the first plurality of trenches. A first plurality of insulator blocks can be disposed between corresponding sections of the first tunnel barrier layer, corresponding sections of the first free magnetic layer and corresponding sections of the first conductive layer in the first plurality of trenches. Similarly, a plurality of sections of a second tunnel barrier layer can be disposed on the walls of the second plurality of trenches. A plurality of sections of a second free magnetic layer can be disposed on the plurality of sections of the second tunnel barrier layer in the second plurality of trenches. A plurality of sections of a second conductive layer can be disposed on the plurality of sections of the second free magnetic layer in the second plurality of trenches. A second plurality of insulator blocks can be disposed between corresponding sections of the second tunnel barrier layer, corresponding sections of the second free magnetic layer and corresponding sections of the second conductive layer in the second plurality of trenches. In addition, an insulator layer can be disposed between a first side of the second reference magnetic layer and a second side of the first reference magnetic layer. A plurality of interconnects can be disposed through the insulator layer and coupled between respective ones of the plurality of sections of the first conductive layer and the second conductive layer.

In yet another embodiment, a memory device can include an array of Magnetic Tunnel Junction (MTJ) cells arranged in cell columns and cell rows in a plurality of cell levels. The MTJ cells in corresponding cell column and cell row positions in the plurality of cell levels can be coupled together in cell strings. The array of MTJ cells can include a first reference magnetic layer including a first plurality of trenches. A plurality of sections of a first tunnel barrier layer can be disposed on the walls of the first plurality of trenches. A plurality of sections of a first free magnetic layer disposed on the plurality of sections of the first tunnel barrier layer in the first plurality of trenches. A plurality of sections of a first conductive layer can be disposed on the plurality of sections of the first free magnetic layer in the first plurality of trenches. A first plurality of insulator blocks can be disposed between corresponding sections of the first tunnel barrier layer, corresponding sections of the first free magnetic layer and corresponding sections of the first conductive layer in the first plurality of trenches. A first insulator layer can be disposed on a first side of the first reference magnetic layer. A first plurality of interconnects can be disposed through the first insulator layer and coupled to respective ones of the plurality of sections of the first conductive layer. The array of MTJ cells can also include a second reference magnetic layer including a second plurality of trenches. A plurality of sections of a second tunnel barrier layer can be disposed on the walls of the second plurality of trenches. A plurality of sections of a second free magnetic layer can be disposed on the plurality of sections of the second tunnel barrier layer in the second plurality of trenches. A plurality of sections of a second conductive layer can be disposed on the plurality of sections of the second free magnetic layer in the second plurality of trenches. A second plurality of insulator blocks can be disposed between corresponding sections of the second tunnel barrier layer, corresponding sections of the second free magnetic layer and corresponding sections of the second conductive layer in the second plurality of trenches. A second insulator layer can be disposed between a fist side of the second reference magnetic layer and a second side of the first reference magnetic layer. A second plurality of interconnects disposed through the second insulator layer and coupled between respective ones of the plurality of sections of the first conductive layer and the second conductive layer.

In yet another embodiment, method of manufacturing a MTJ can include forming a planar reference magnetic layer on a planar non-magnetic insulator layer. One or more trenches can be formed through the planar reference magnetic layer. One or more portions of a tunnel insulator layer can be formed on the walls of the one or more trenches. One or more portions of a free magnetic layer can be formed on the one or more portions of the tunnel insulator layer inside the one or more trenches. One or more insulator blocks can be formed adjacent one or more portions of the free magnetic layer in the one or more trenches. One or more conductive cores can be formed between the one or more insulator blocks and between the one or more portions of the free magnetic layer in the one or more trenches.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIGS. 13A and 13B show a method of fabricating a MTJ, in accordance with aspects of the present technology.

DETAILED DESCRIPTION OF THE INVENTION

Figure 1:
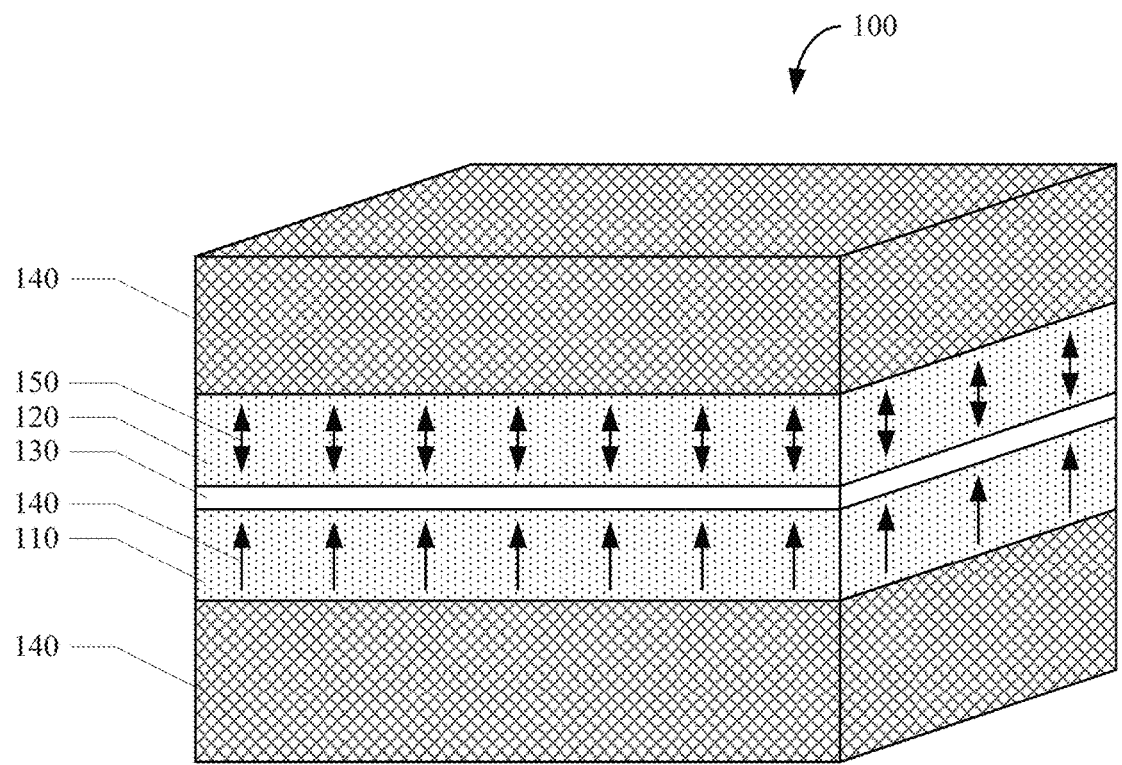
FIG. 1 shows a Magnetic Tunnel Junction (MTJ), in accordance with the conventional art.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
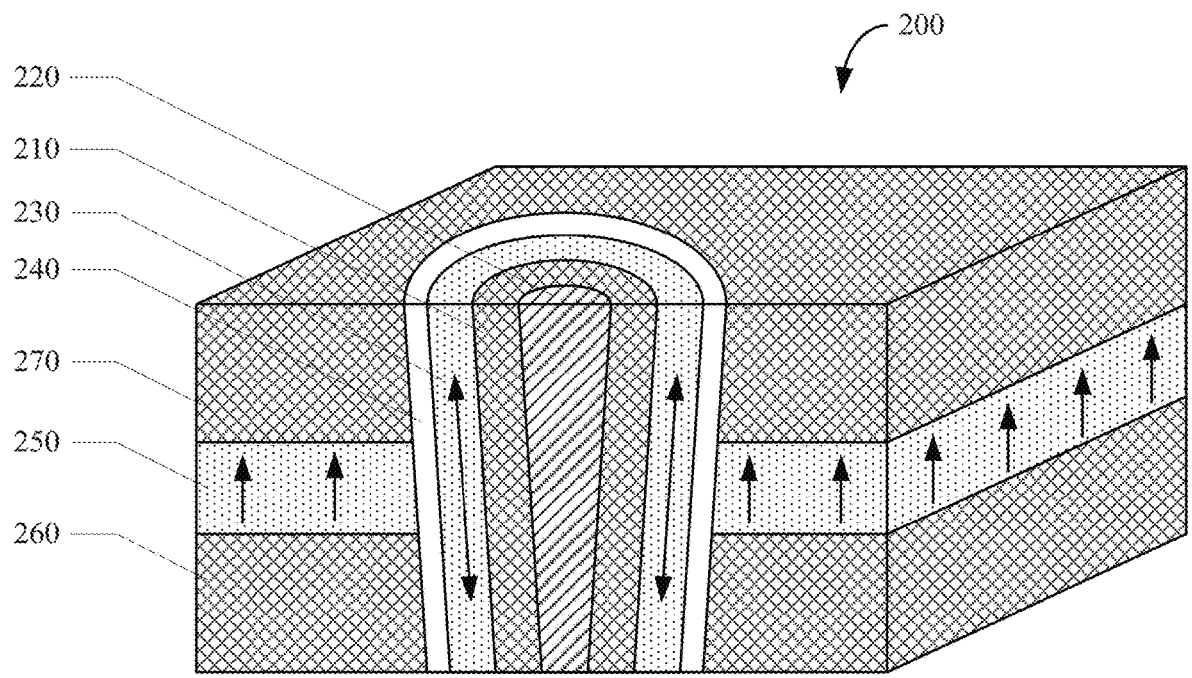
FIG. 2 shows a MTJ, in accordance with aspects of the present technology.

Referring to FIG. 2, a Magnetic Tunnel Junction (MTJ), in accordance with aspects of the technology in the applications identified in the above Cross-Reference to Relate Applications, is shown. The 200 can include an annular structure 210-240 including an annular non-magnetic layer 210 disposed about an annular conductive layer 220, an annular free magnetic layer 230 disposed about the annular non-magnetic layer 210, and an annular tunnel barrier layer 240 disposed about the annular free magnetic layer 230. The MTJ 200 can also include a planar reference magnetic layer 250 disposed about the annular structure 210-240 and separated from the free magnetic layer 230 by the annular tunnel barrier layer 240.

The MTJ 200 can further include a first planar non-magnetic insulator layer 260 disposed about the annular structure 210-240 and on a first side of the planar reference magnetic layer 250. The MTJ can further include a second planar non-magnetic insulator layer 270 disposed about the annular structure 210-240 and on a second side of the planar reference magnetic layer 250.

In one implementation, the annular structure can be a substantially cylindrical structure with tapered sidewalls. In one implementation, the conical structure can have a taper of approximately 10-45 degrees from a first side of the planar reference magnetic layer 250 to a second side of the planar reference magnetic layer 250. In another expression, the wall angle measured from the normal axis to the horizontal direction of the planar reference magnetic layer 250 can be approximately 10-45 degrees. In one implementation, the annular tunnel insulator 240, the annular free magnetic layer 230, and the annular non-magnetic layer 210 can be concentric regions each bounded by inner and outer respective tapered cylinders having substantially the same axis, disposed about a solid tapered cylindrical region of the annular conductive layer 220.

In aspects, the magnetic field of the planar reference magnetic layer 250 can have a fixed polarization substantially perpendicular to a major planar orientation of the planar reference magnetic layer 250. The magnetic field of the annular free magnetic layer 230 can have a polarization substantially perpendicular to the major planar orientation of the planar reference magnetic layer 250 and selectively switchable between being substantially parallel and substantially antiparallel to the magnetic field of the planar reference layer 250. In one implementation, the magnetic field of the annular free magnetic layer 230 can be configured to switch to being substantially parallel to the magnetic field of the planar reference layer 250 in response to a current flow in a first direction through the conductive annular layer 220 and to switch to being substantially anti-parallel to the magnetic field of the planar reference layer 250 in response to a current flow in a second direction through the conductive annular layer 220. More generally, the polarization direction, either parallel or anti-parallel, can be changed by a corresponding change in the current direction. Therefore, regardless of the definition of the current flowing direction, the polarization of the annular free magnetic layer 230 can switch to the other polarization orientation by switching the current direction.

Figure 3:
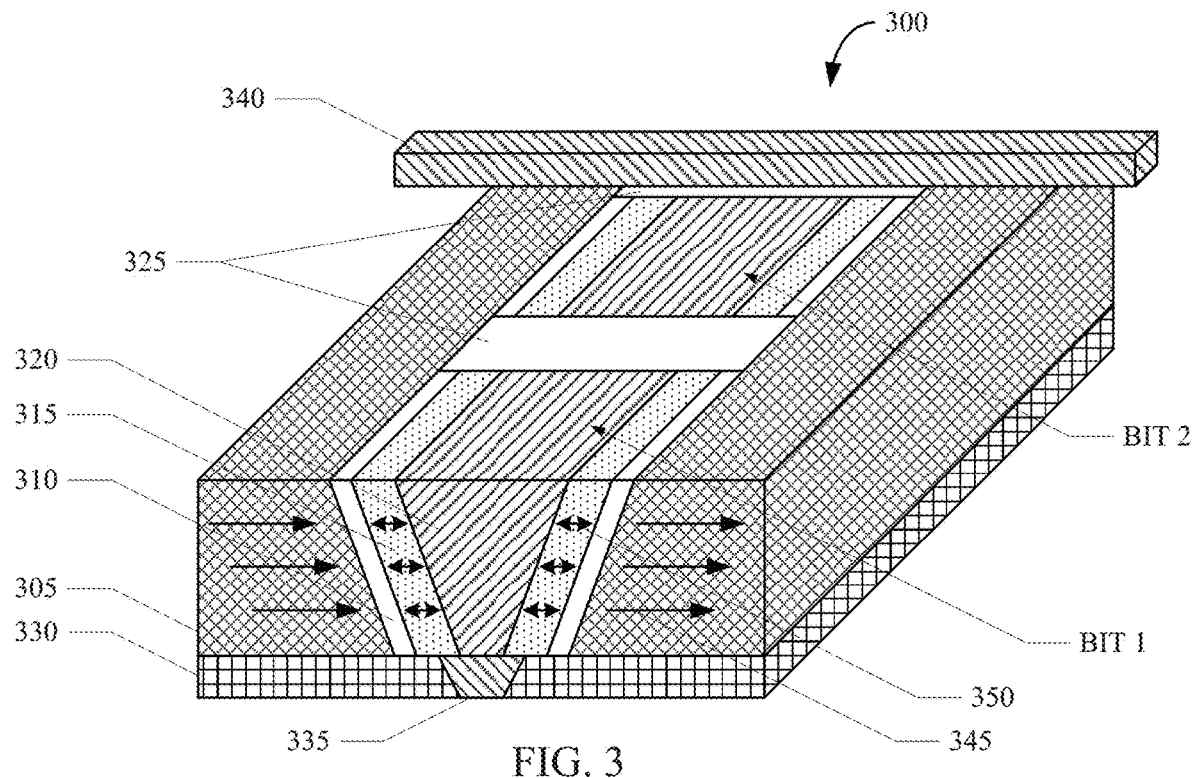
FIG. 3 shows one or more MTJs, in accordance with aspects of the present technology.

Referring to FIG. 3, one or more Magnetic Tunnel Junctions (MTJs), in accordance with aspects of the present technology, is shown. The one or more MTJs 300 can include a reference magnetic layer 305 including one or more trenches. The one or more MTJs 300 can further include one or more sections of a tunnel barrier layer 310 disposed on the walls of the one or more trenches, one or more sections of a free magnetic layer 315 disposed on the one or more sections of the tunnel barrier layer 310 in the one or more trenches, and one or more sections of a conductive layer 320 disposed on the one or more sections of the free magnetic layer 315 in the one or more trenches. The one or more MTJs 300 can also optionally include one or more sections of a non-magnetic capping layer (not shown) disposed between the one or more sections of the free magnetic layer 315 and the one or more sections of the conductive layer 320 in the one or more trenches. The one or more MTJs 300 can further include one or more insulator blocks 325 disposed between corresponding sections of the tunnel barrier layer 310, free magnetic layer 315 and conductive layer 320. For example, an insulator block 325 can be disposed between a first and second set of corresponding sections of the tunnel barrier layer 310, free magnetic layer 315, the optional non-magnetic capping layer and the conductive layer 320 to form a first MTJ (e.g., Bit 1) and a second MTJ (e.g., Bit 2).

The one or more MTJs 300 can further include a first set of one or more additional layers disposed on a first side of the reference magnetic layer 305. In one instance, the first set of one or more additional layers can include a conductive buffer layer (e.g., Perpendicular Magnetic Anisotropy (PMA) enhancer) (not shown), an insulator layer 330 and one or more interconnects 335. For example, the insulator layer 330 can be disposed on the first side of the reference magnetic layer 305, the tunnel barrier layer 310 and free magnetic layer 315. The interconnect 335 can be coupled to the conductive layer 320.

The one or more MTJs 300 can further include one or more bit lines 340 disposed on a second side of the reference magnetic layer 305, and across one or more insulator blocks 325. For example, one or more bit lines 340 can be coupled to one or more portions of reference magnetic layer 305, and isolated from the tunnel barrier layer 310, free magnetic layer 315 and conductive layer 320 by the one or more insulator blocks 325. The one or more MTJs 300 can also include a second set of one or more additional layers (not shown) disposed on the second side of the reference magnetic layer 305. In one instance, the second set of one or more additional layers can include a capping layer (e.g., PMA enhancer) and an insulator layer.

In one implementation, the reference magnetic layer 305 can include one or more layers of a Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof, with a thickness of approximately 1-20 nm, preferably 1 to 10 nm, and more preferably 1 to 5 nm. The tunnel insulator layer 310 can include one or more layers of a Magnesium Oxide (MgO), Silicon Oxide (SiOx), Aluminum Oxide (AlOx), Titanium Oxide (TiOx) or combination of these oxide materials with a thickness of approximately 0.2 to 2.0 nm. The free magnetic layer 315 can include one or more layers of a Cobalt-Iron-Boron (Co—Fe—B), Cobalt-Nickle-Iron (CoNiFe), Nickle-Iron (NiFe) alloy or their multilayer combinations with a thickness of approximately 1-10 nm, and preferably 1 to 5 nm. The non-magnetic capping layer (not shown) can include one or more layers of metal protecting layers that can include one or more elements of a Tantalum (Ta), Chromium (Cr), Tungsten (W), Vanadium (V), Platinum (Pt), Ruthenium (Ru), Palladium (Pd), Copper (Cu), Silver (Ag), Rhodium (Rh), or their alloy, with a thickness of approximately 1 to 5 nm. The conductive layer 320 can include one or more layers of Copper (Cu), Aluminum (Al), Ruthenium (Ru), and/or one or more alloys thereof with a thickness of approximately 5-20 nm. The first and second sets of additional layers can include one or more insulator layers of MgO, SiOx, AlOx. are alloys thereof with a thickness of the first and second additional layers in the range of 5 to 20 nm, preferably 5 to 10 nm. The first and second sets of additional layers can also include one or more buffer and/or capping layers of Ta, Cr, W, V, Mo, Pt, Ru, Pd, Cu, Ag, Rh, or their alloy, with a thickness of approximately 1 to 10 nm.

In one implementation, the walls of the one or more trenches can have a taper of approximately 10-45 degrees from the second side of the reference magnetic layer 305 to the first side of the planar reference magnetic layer 305. In another expression, the wall angle measured from the normal axis to the horizontal direction of the reference magnetic layer 305 can be approximately 10-45 degrees.

In aspects, the magnetic field 345 of the reference magnetic layer 305 can have a fixed polarization substantially parallel to a major planar orientation of the planar reference magnetic layer 305, and the magnetic field 350 of the free magnetic layer 315 can have a polarization substantially parallel to the major planar orientation of the reference magnetic layer 305, as illustrated in FIG. 3. The magnetic field 350 of the free magnetic layer 315 can be selectively switchable between being substantially parallel and substantially antiparallel to the magnetic field 345 of the planar reference layer 305. In one implementation, the magnetic field 350 of the free magnetic layer 315 can be configured to switch to being substantially parallel to the magnetic field 345 of the reference layer 305 in response to a current flow in a first direction through the conductive layer 320 and to switch to being substantially anti-parallel to the magnetic field 345 of the reference layer 305 in response to a current flow in a second direction through the conductive layer 320. More generally, the polarization direction, either parallel or anti-parallel, can be changed by a corresponding change in the current direction. Therefore, regardless of the definition of the current flowing direction, the polarization of the free magnetic layer 315 can switch to the other polarization orientation by switching the current direction.

Figure 4:
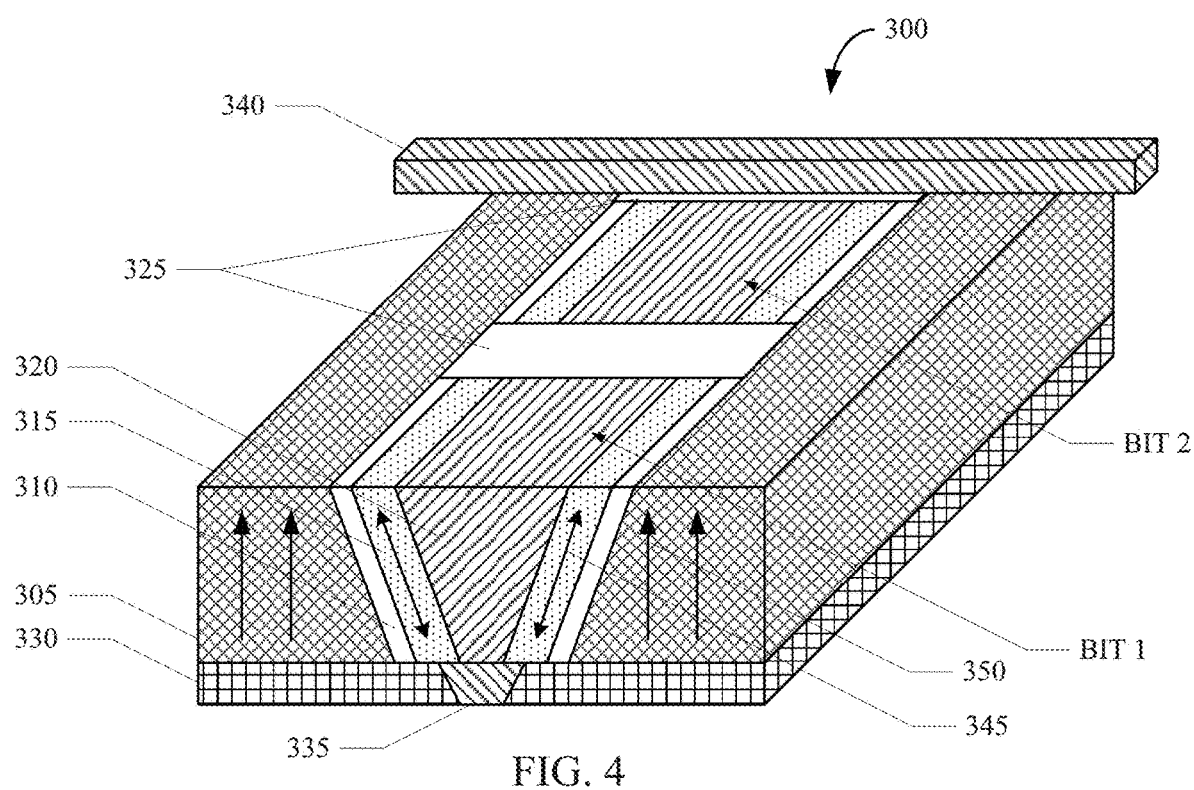
FIG. 4 shows one or more MTJs, in accordance with aspects of the present technology.

In another implementation, the magnetic field 345 of the reference magnetic layer 305 can have a fixed polarization substantially perpendicular to a major planar orientation of the planar reference magnetic layer 305, and the magnetic field 350 of the free magnetic layer 315 can have a polarization substantially perpendicular to the major planar orientation of the reference magnetic layer 305, as illustrated in FIG. 4.

Figure 5:
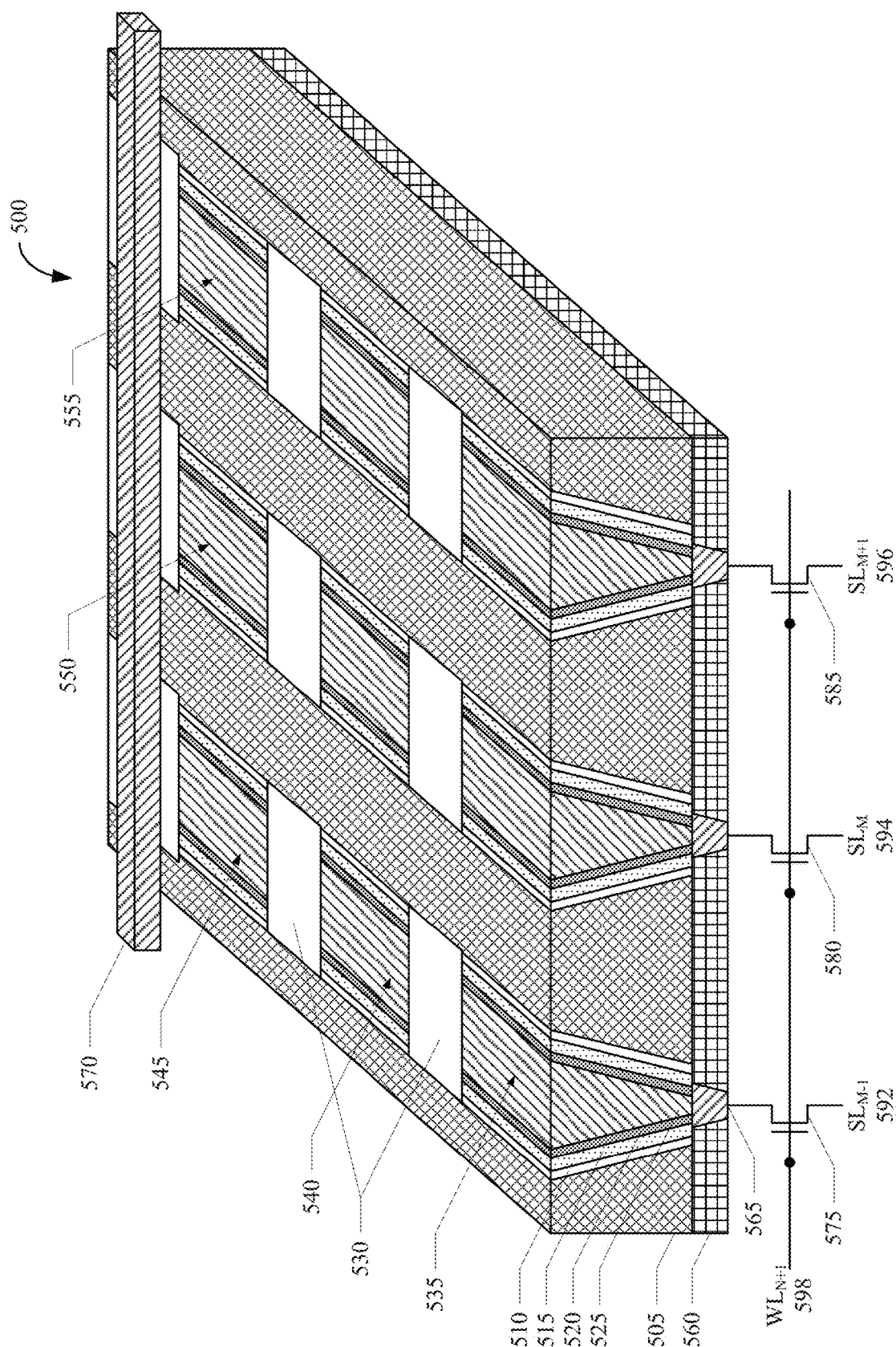
FIG. 5 shows a device including an array of MTJs, in accordance with aspects of the present technology.

Referring now to FIG. 5, a device including an array of Magnetic Tunnel Junctions (MTJs), in accordance with aspects of the present technology, is shown. In one implementation, the device 500 can be a memory cell array. The device 500 can include a reference magnetic layer 505 including a plurality of trenches. The trenches can be substantially parallel to each other. The device 500 can further include a plurality of sections of a tunnel barrier layer 510 disposed on the walls of the trenches, a plurality of sections of a free magnetic layer 515 disposed on the sections of the tunnel barrier layer 510 in the trenches, a plurality of sections of an optional non-magnetic capping layer 520 disposed on the sections of the free magnetic layer 515 and one or more sections of a conductive layer 525 disposed on the one or more sections of the non-magnetic capping layer 520 in the one or more trenches. The device 500 can further include a plurality of insulator blocks 530 disposed between corresponding sections of the tunnel barrier layer 510, free magnetic layer 515, optional non-magnetic capping layer 520 and conductive layer 525. For example, insulator blocks 530 can be disposed between a first, second and third set of corresponding sections of the tunnel barrier layer 510, free magnetic layer 515, the optional non-magnetic capping layer 520 and the conductive layer 525 to form a first MD 535, a second MD 540 and third MTJ 545. The insulator blocks 530 can be arranged in an array in the plurality of trenches to form rows of MTJs 535, 540, 545 along trenches, and columns of MTJs 545, 550, 555 across the trenches.

The one or more MTJs 500 can further include a first set of one or more additional layers disposed on a first side of the reference magnetic layer 505. In one instance, the first set of one or more additional layers can include a conductive buffer layer (e.g., Perpendicular Magnetic Anisotropy (PMA) enhancer for one of the implementations) (not shown), an insulator layer 560 and an interconnect 565. For example, the insulator layer 560 can be disposed on the first side of the reference magnetic layer 505, the tunnel barrier layer 510 and free magnetic layer 415. The interconnect 565 can be coupled to the conductive layer 545 and the optional non-magnetic capping layer 520.

The device 500 can further include one or more bit lines 570 disposed on a second side of the reference magnetic layer 505, and across one or more insulator blocks 530. For example, one or more bit lines 570 can be coupled to one or more portions of reference magnetic layer 505, and isolated from the free magnetic layer 515, optional non-magnetic capping layer 520 and conductive layer 525 by the one or more insulator blocks 530. The device 500 can also include a second set of one or more additional layers (not shown) disposed on the second side of the reference magnetic layer 505. In one instance, the second set of one or more additional layers can include a capping layer (e.g., PMA enhancer for one of the implementations) and an insulator layer. The device can further include a plurality of select elements 575, 580, 585, a plurality of source lines 592, 594, 596, and a plurality of word lines 598. The MTJ cells 535-555 arranged along columns and rows can be coupled by a corresponding select transistor 575, 580, 585 to a respective source line 592, 594, 596. The gate of the select transistors 575, 580, 585 can be coupled to a respective word line 598.

In one implementation, the reference magnetic layer 505 can include one or more layers of a Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof, with a thickness of approximately 1-20 nm, preferably 1 to 10 nm, and more preferably 1 to 5 nm. The tunnel insulator layer 510 can include one or more layers of a Magnesium Oxide (MgO), Silicon Oxide (SiOx), Aluminum Oxide (AlOx), Titanium Oxide (TiOx) or combination of these oxide materials with a thickness of approximately 0.2 to 2.0 nm. The free magnetic layer 515 can include one or more layers of a Cobalt-Iron-Boron (Co—Fe—B), Cobalt-Nickle-Iron (CoNiFe), Nickle-Iron (NiFe) alloy or their multilayer combinations with a thickness of approximately 1-10 nm, and preferably 1 to 5 nm. The non-magnetic capping layer 520 can include one or more layers of metal protecting layers that can include one or more elements of a Tantalum (Ta), Chromium (Cr), Tungsten (W), Vanadium (V), Platinum (Pt), Ruthenium (Ru), Palladium (Pd), Copper (Cu), Silver (Ag), Rhodium (Rh), or their alloy, with a thickness of approximately 1 to 5 nm. The conductive layer 525 can include one or more layers of Copper (Cu), Aluminum (Al), Ruthenium (Ru), and/or one or more alloys thereof with a thickness of approximately 5-20 nm. The first and second sets of additional layers can include one or more insulator layers of MgO, SiOx, AlOx and alloys thereof with a thickness of the first and second additional layers in the range of 5 to 20 nm, preferably 5 to 10 nm. The first and second sets of additional layers can also include one or more buffer and/or capping layers of Ta, Cr, W, V, Mo, Pt, Ru, Pd, Cu, Ag, Rh, or their alloy, with a thickness of approximately 1 to 10 nm.

In one implementation, the walls of the one or more trenches can have a taper of approximately 10-45 degrees from the second side of the reference magnetic layer 505 to the first side of the reference magnetic layer 505. In another expression, the wall angle measured from the normal axis to the horizontal direction of the reference magnetic layer 505 can be approximately 10-45 degrees.

In aspects, the magnetic field of the reference magnetic layer 505 can have a fixed polarization substantially parallel to a major planar orientation of the planar reference magnetic layer 505, and the magnetic field of the free magnetic layer 515 can have a polarization substantially parallel to the major planar orientation of the reference magnetic layer 505, as illustrated in FIG. 3. The magnetic field of a given portion of the free magnetic layer 515 can be selectively switchable between being substantially parallel and substantially anti-parallel to the magnetic field of the planar reference layer 505. In one implementation, the magnetic field of a given portion of the free magnetic layer 515 can be configured to switch to being substantially parallel to the magnetic field of the reference layer 505 in response to a current flow in a first direction through a corresponding portion of the conductive layer 525 and to switch to being substantially anti-parallel to the magnetic field of the reference layer 505 in response to a current flow in a second direction through the corresponding portion of the conductive layer 525. In another implementation, the magnetic field of the reference magnetic layer 505 can have a fixed polarization substantially perpendicular to a major planar orientation of the planar reference magnetic layer 505, and the magnetic field of the free magnetic layer 515 can have a polarization substantially perpendicular to the major planar orientation of the reference magnetic layer 505, as illustrated in FIG. 4.

Figure 6:
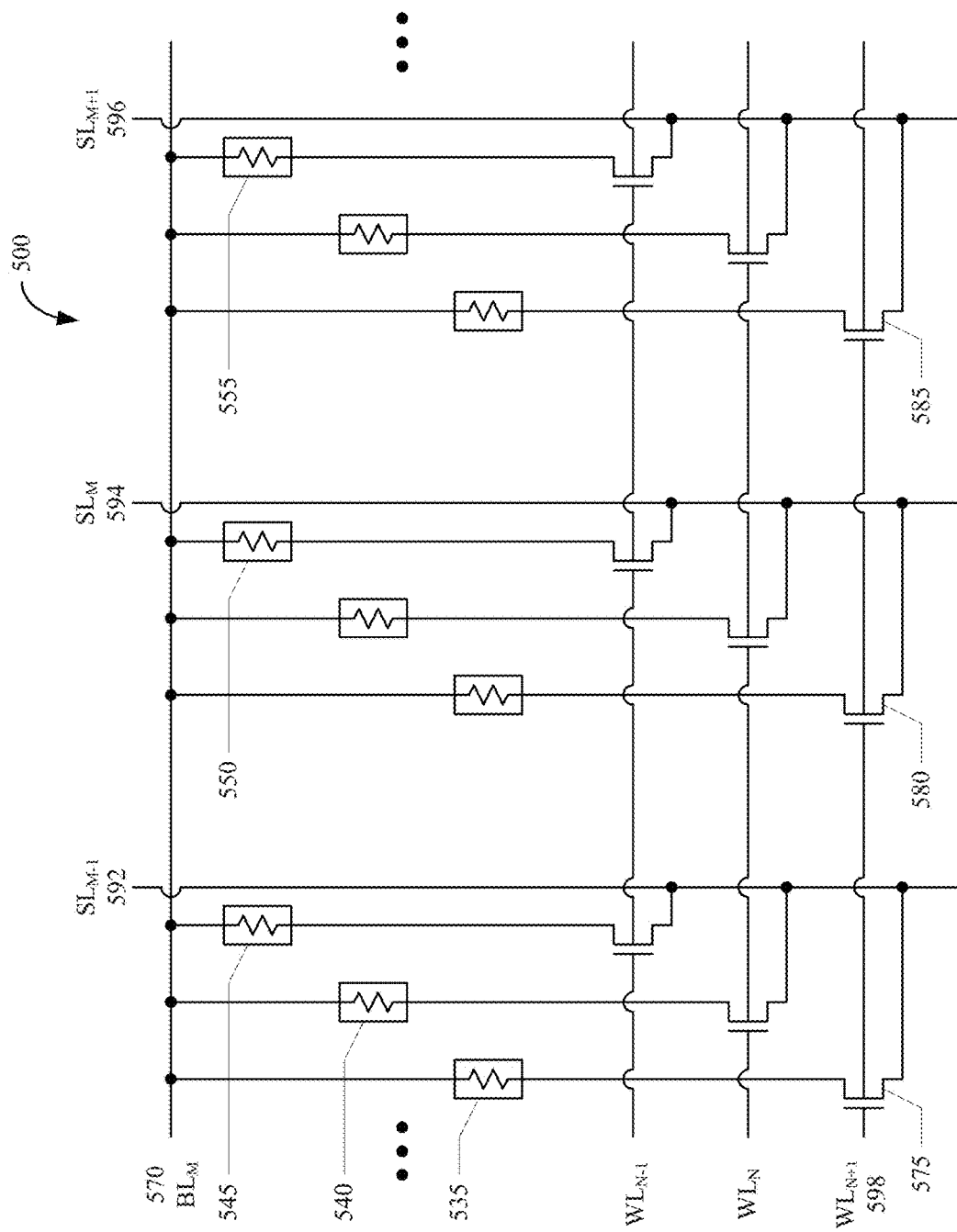
FIG. 6 shows a device including an array of MTJs, in accordance with aspects of the present technology.

Referring now to FIG. 6, a schematic representation of a memory cell array as described above with respect to FIG. 5 is shown. The memory cell array 500 can include a plurality of MTJ cells 535-555, a plurality of bit lines 570, a plurality of source lines 592, 594, 596, a plurality of word lines 598, and a plurality of select transistor 575, 580, 585. The plurality of MTJ cells 535-555 can be coupled to one or more bit lines 570. The MTJ cells arranged along columns 535, 540, 545 can be coupled by a corresponding select transistor 598 to a respective source line 592, 594, 596. The gate of the select transistors 592, 594, 596 can be coupled to a respective word line 598. In one implementation, a logic '0' state can be written to a given memory cell 53510 by biasing the respective bit line 570 at a bit line write potential (e.g., $V_{BLW}$), biasing the respective source line 575 at a ground potential, and driving the respective word line 598 at a word line write potential (e.g., $V_{WLW}=V_{Hi}$). The word lines 598 for the cells that are not being written to can be biased at a ground potential. In addition, the other source lines 594, 596 can be biased at a high potential or held in a high impedance state. The high potential can be equal to the bit line write potential or some portion thereof. A logic '1' state can be written to the given memory cell 535 by biasing the respective bit line 570 at a ground potential, biasing the respective source line 592 at a source line write potential (e.g., $V_{SLW}$), and driving the respective word line 598 at the word line write potential (e.g., $V_{WLW}=V_{Hi}$). The word lines 598 for the cells that are not being written to can be biased at ground potential. In addition, the other source lines 594, 596 can be biased at a low potential or held in a high impedance state. The state of the given memory cell 535 can be read by biasing the respective bit line 570 at a bit line read potential (e.g., $V_{BLR}$), biasing the respective source line 592 at a ground potential, driving the respective word line 598 at a word line read potential ($V_{WLR}=V_{Hi}$), and sensing the resulting current on the respective source line 592. The word lines for the cells that are not being read can be biased at a ground potential. In addition, the other source lines 594, 596 can be biased at a high potential or held in a high impedance state. The high potential can be equal to the bit line read potential or some portion thereof.

Figure 7:
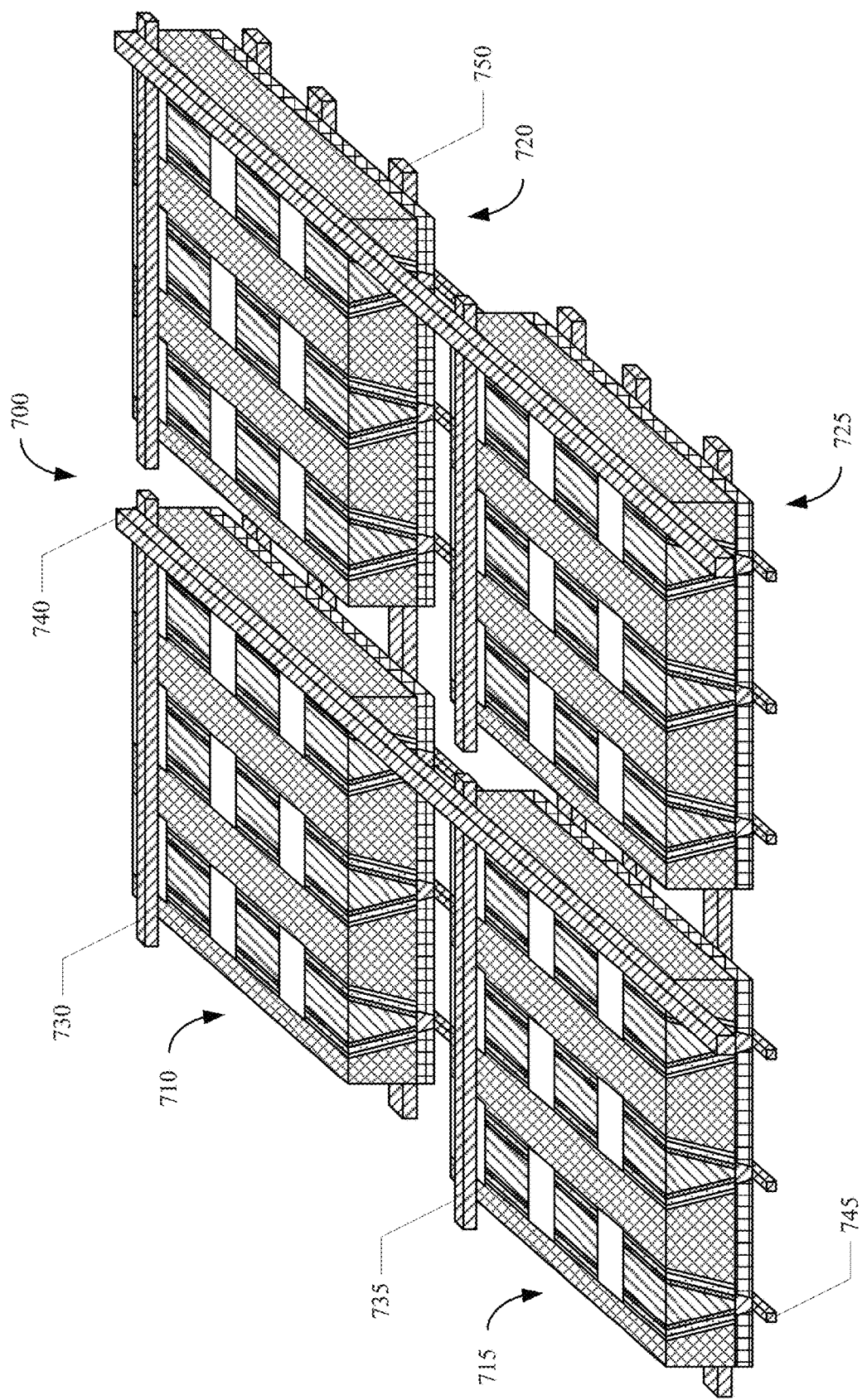
FIG. 7 shows a memory device, in accordance with aspects of the present technology.

Referring now to FIG. 7, a memory device, in accordance with aspects of the present technology, is shown. The memory device 700 can include a plurality of memory cell array blocks 705-720. Each memory cell array block 705-720 can include a plurality of MTJ cells as described above in more detail with respect to FIGS. 5 and 6. Two or more bit lines 730, 735 of the memory cell array blocks 710, 715 arranged in respective columns can be coupled together by a corresponding global bit line 740. In addition, the source lines 745 of the memory cell array blocks 710, 715 arranged in respective columns can be coupled together. Likewise, the word lines 750 of the memory cell array blocks 715, 725 arranged in respective rows can be coupled together. The memory device 700 will be further explained with reference to FIG. 8, which illustrates a schematic representation of the memory device.

Figure 8:
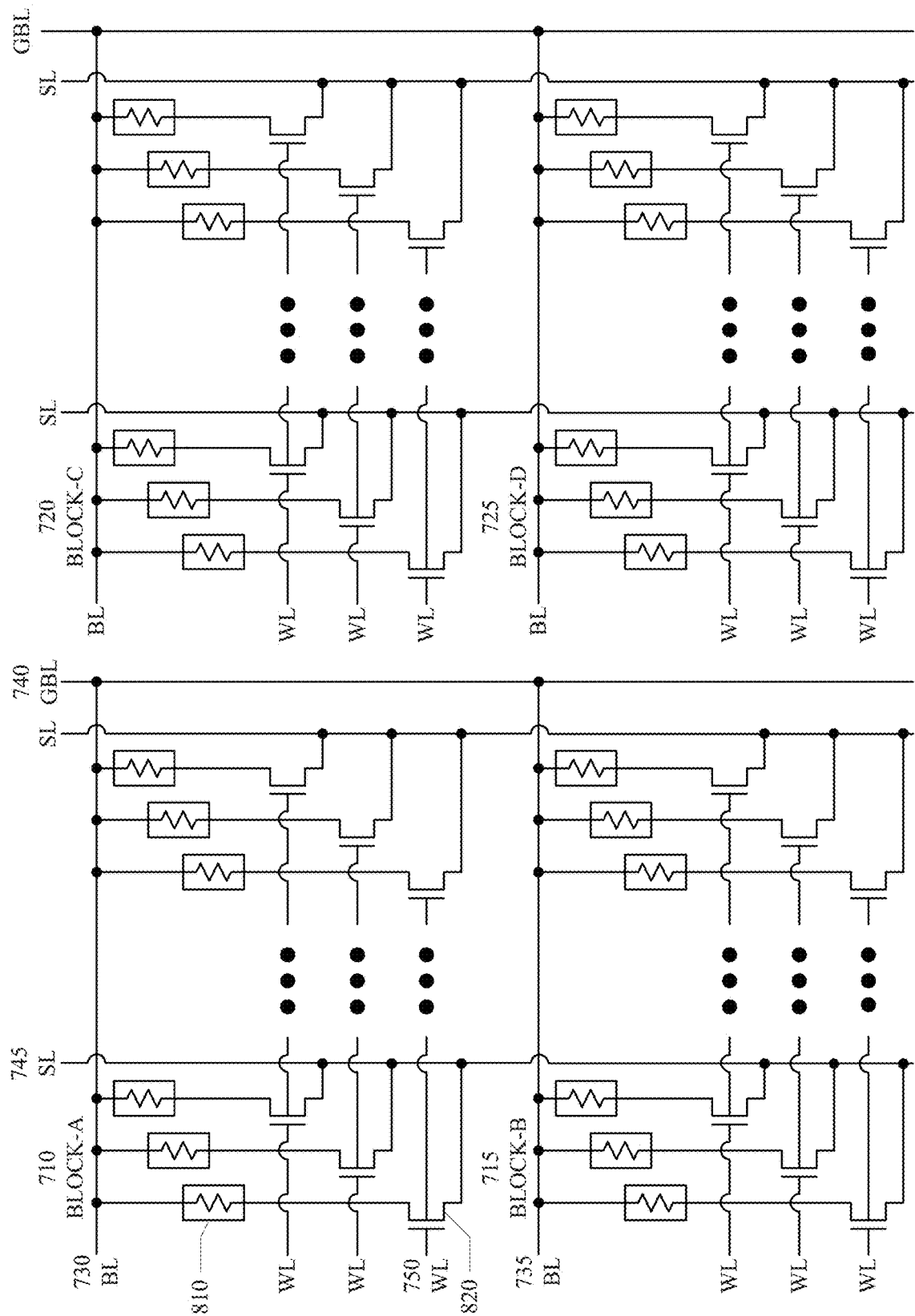
FIG. 8 shows a memory device, in accordance with aspects of the present technology.

Referring now to FIG. 8, the memory device 700 can include a plurality of memory cell array blocks 705-720. Each memory cell array block can include a plurality of MTJ cells 810, a plurality of bit lines 730, a plurality of source lines 745, a plurality of word lines 750, and a plurality of select transistor 820. The MTJ cells arranged along columns 810 can be coupled by a corresponding select transistor 820 to a respective source line 745. The gate of the select transistors can be coupled to a respective word line 750. Two or more bit lines 730, 735 of the memory cell array blocks 710, 715 arranged in respective columns can be coupled together by a corresponding global bit line 740. In addition, the source lines 745 of the memory cell array blocks 710, 715 arranged in respective columns can be coupled together. Likewise, the word lines 750 of the memory cell array blocks 715, 725 arranged in respective rows can be coupled together.

In one implementation, logic '0' and '1' states can be written to a given memory cell 810 by biasing the global bit line 740 which also biases the respective bit line 730 at a bit line write potential (e.g., $V_{BLW}$), biasing the respective source line 745 at a ground potential, and driving the respective word line 750 at a word line write potential (e.g., $V_{WLW}=V_{Hi}$). The word lines for the cells that are not being written to can be biased at a ground potential. In addition, the other source lines can be biased at a high potential or held in a high impedance state. The high potential can be equal to the bit line write potential or some portion thereof. A logic '1' state can be written to the given memory cell 810 by biasing the global bit line 740 which also biases the respective bit line 730 at a ground potential, biasing the respective source line 745 at a source line write potential (e.g., $V_{SLW}$), and driving the respective word line 750 at the word line write potential (e.g., $V_{WLW}=V_{Hi}$). The word lines for the cells that are not being written to can be biased at ground potential. In addition, the other source lines can be biased at a low potential or held in a high impedance state. The state of the given memory cell 810 can be read by biasing the global bit line 740 which also biases the respective bit line 730 at a bit line read potential (e.g., $V_{BLR}$), biasing the respective source line 745 at a ground potential, driving the respective word line 750 at a word line read potential ($V_{WLR}=V_{Hi}$), and sensing the resulting current on the respective source line 745. The word lines for the cells that are not being read can be biased at a ground potential. In addition, the other source lines can be biased at a high potential or held in a high impedance state. The high potential can be equal to the bit line read potential or some portion thereof.

Figure 9:
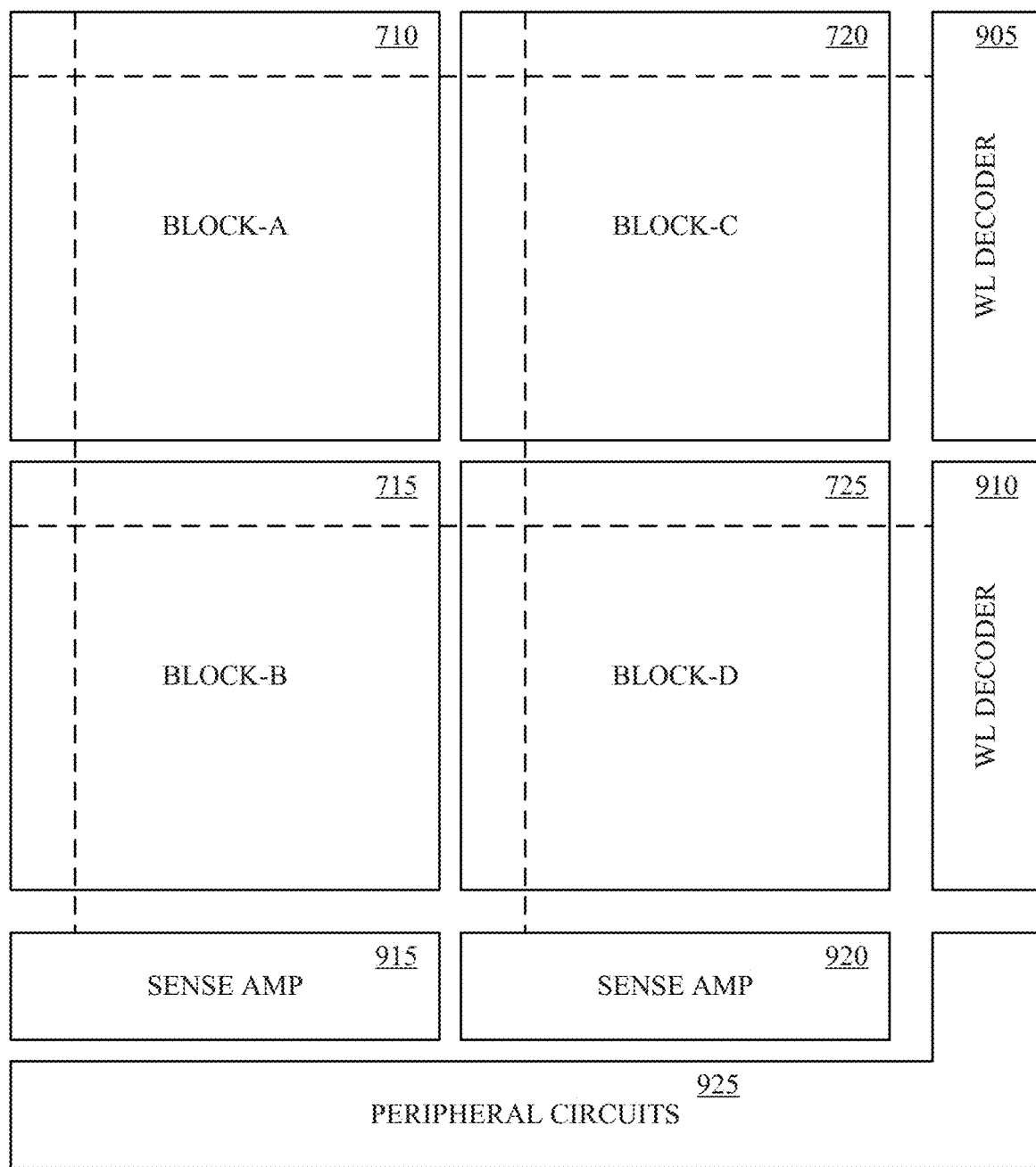
FIG. 9 shows a memory device, in accordance with aspects of the present technology.

Referring now to FIG. 9, a memory device, in accordance with aspects of the present technology, is shown. In one implementation, the memory device can be a Magnetoresistive Random Access Memory (MRAM). The memory device 900 can include a plurality of memory cell array blocks 710-725, one or more word line decoders 905, 910, one or more sense amplifier circuits 915, 920, and peripheral circuits 925. The memory device 900 can include other well-known circuits that are not necessary for an understanding of the present technology and therefore are not discussed herein.

Each memory cell array block 710-725 can include can include a plurality of MTJ cells 810, a plurality of bit lines 730, a plurality of source lines 745, a plurality of word lines 750, and a plurality of select transistor 820 as described in more detail above with reference to FIGS. 7 and 8. The peripheral circuits 925, the word line decoders 905, 910 and sense amplifier circuits 915, 920 can map a given memory address to a particular row of MTJ memory cells in a particular memory cell array block 710-725. The output of the word line drivers 905, 910 can drive the word lines to select a given word line of the array. The sense amplifier circuits 915, 920 utilize the source lines and bit lines of the array to read from and write to memory cells of a selected word line in a selected memory cell array block 710-725.

In one aspect, the peripheral circuits 925 and the word line decoders 905, 910 can be configured to apply appropriate write voltages to bit lines, source lines and word lines to write data to cells in a selected word. The magnetic polarity, and corresponding logic state, of the free layer of the MTJ cell can be changed to one of two states depending upon the direction of current flowing through the MTJ cell. For read operations, the peripheral circuits 925, the word line decoders 905, 910 and sense amplifier circuits 915, 920 can be configured to apply appropriate read voltages to the bit lines, sources lines and word lines to cause a current to flow in the source lines that can be sensed by the sense amplifier circuits 915, 920 to read data from cells in a selected word.

Figure 10:
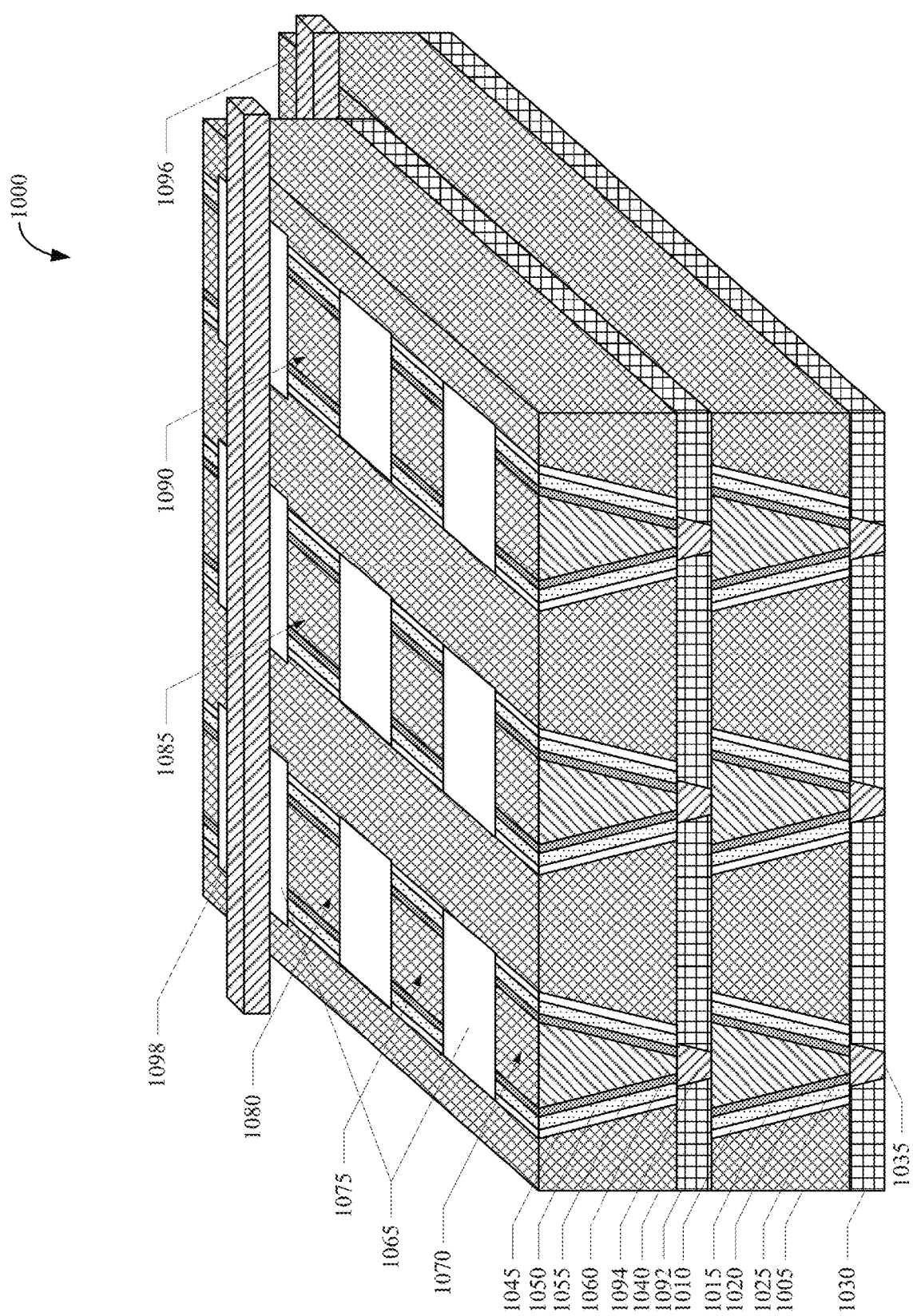
FIG. 10 shows a device including an array of MTJ cells, in accordance with aspects of the present technology.

Referring now to FIG. 10, a device including an array MTJs, in accordance with aspects of the present technology, is shown. In one implementation, the device 1000 can be a memory cell array. The device can include a first magnetic layer 1005 including a first plurality of trenches. The first plurality of trenches can be substantially parallel to each other. The device 1000 can further include a plurality of sections of a first tunnel barrier layer 1010 disposed on the wall of the first plurality of trenches, a plurality of sections of a first free magnetic layer 1015 disposed on the sections of the first tunnel barrier layer 1010, a plurality of sections of an optional first non-magnetic capping layer 1020 disposed on the sections of the first free magnetic layer 1015, and a plurality of sections of a first conductive layer 1025 disposed on the sections of the optional first non-magnetic capping layer 1020 in the first plurality of trenches. The device 1000 can further include a first plurality of insulator blocks disposed between corresponding sections of the first tunnel barrier layer 1010, the first free magnetic layer 1015, the optional first non-magnetic capping layer 1020, and the first conductive layer 1025. The first plurality of insulator blocks can be arranged in an array in the plurality of trenches to form rows of MTJs along the first plurality of trenches, and columns of MTJs across the first plurality of trenches. The device 1000 can further include a first insulator layer 1030 and a first plurality of interconnects 1035. The first insulator layer 1030 can be disposed on the first side of the reference magnetic layer 1005, the first tunnel barrier layer 1010, and the first free magnetic layer 1015. The first plurality of interconnects 1035 can be coupled to the first conductive layer 1025 and the optional first magnetic capping layer 1020.

The device 1000 can further include a second magnetic layer 1040 including a second plurality of trenches. The second plurality of trenches can be substantially parallel to each other and to the first plurality of trenches in the first magnetic layer 1005. The device 1000 can further include a plurality of sections of a second tunnel barrier layer 1045 disposed on the wall of the second plurality of trenches, a plurality of sections of a second free magnetic layer 1050 disposed on the sections of the second tunnel barrier layer 1045, a plurality of sections of an optional second non-magnetic capping layer 1055 disposed on the sections of the second free magnetic layer 1050, and a plurality of sections of a second conductive layer 1060 disposed on the sections of the optional second non-magnetic capping layer 1055 in the second plurality of trenches. The device 1000 can further include a second plurality of insulator blocks 1065 disposed between corresponding sections of the second tunnel barrier layer 1045, the second free magnetic layer 1050, the optional second non-magnetic capping layer 1055, and the second conductive layer 1060. The second plurality of insulator blocks 1065 can be arranged in an array in the second plurality of trenches to form rows of MTJs 1070-1080 along the second plurality of trenches, and columns of MTJs 1080-1090 across the second plurality of trenches. The device 1000 can further include a second insulator layer 1092 and a second plurality of interconnects 1094. The second insulator layer 1092 can be disposed between the first and second reference magnetic layers 1005, 1040, the first and second tunnel barrier layers 1010, 1045, and the first and second free magnetic layers 1015, 1050. The second plurality of interconnects 1094 can be coupled between the first and second conductive layers 1025, 1060 and the optional first and second magnetic capping layers 1020, 1055. The second plurality of interconnects 1094 can be configured to couple corresponding MTJs in a given row and column position in strings.

The device 1000 can further include bit lines 1096, 1098 disposed on a second side of the first and second reference magnetic layer 1005, 1040, and across one or more of the first and second plurality of insulator blocks 1065. For example, a first bit line 1096 can be coupled to one or more portions of the first reference magnetic layer 1005, and isolated from the first free magnetic layer 1015, the optional first non-magnetic capping layer 1020 and the first conductive layer 1025 by one or more of the first plurality of insulator blocks. A second bit line 1098 can be coupled to one or more portions of the second reference magnetic layer 1040, and isolated from the second free magnetic layer 1050, the optional second non-magnetic capping layer 1055 and the second conductive layer 1060 by one or more of the second plurality of insulator blocks 1065.

Although FIG. 10 illustrates a device 1000 including two levels of MTJ cells, the device can further include MTJ cells in any number of levels. The device 1000 can further include a plurality of select elements, a plurality of source lines and a plurality of word lines as illustrated in FIG. 5. Strings of the MTJ cells arranged along columns and rows can be coupled by a corresponding select transistor to a respective source line. The gate of the select transistors can be coupled to a respective word line.

In one implementation, the reference magnetic layers 1005, 1040 can include one or more layers of a Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof, with a thickness of approximately 1-20 nm, preferably 1 to 10 nm, and more preferably 1 to 5 nm. The tunnel insulator layers 1010, 1045 can include one or more layers of a Magnesium Oxide (MgO), Silicon Oxide (SiOx), Aluminum Oxide (AlOx), Titanium Oxide (TiOx) or combination of these oxide materials with a thickness of approximately 0.2 to 2.0 nm. The free magnetic layers 1015, 1050 can include one or more layers of a Cobalt-Iron-Boron (Co—Fe—B), Cobalt-Nickle-Iron (CoNiFe), Nickle-Iron (NiFe) alloy or their multilayer combinations with a thickness of approximately 1-10 nm, and preferably 1 to 5 nm. The non-magnetic capping layers 1020, 1055 can include one or more layers of metal protecting layers that can include one or more elements of a Tantalum (Ta), Chromium (Cr), Tungsten (W), Vanadium (V), Platinum (Pt), Ruthenium (Ru), Palladium (Pd), Copper (Cu), Silver (Ag), Rhodium (Rh), or their alloy, with a thickness of approximately 1 to 5 nm. The conductive layers 1025, 1060 can include one or more layers of Copper (Cu), Aluminum (Al), Ruthenium (Ru), and/or one or more alloys thereof with a thickness of approximately 5-20 nm.

In one implementation, the walls of the one or more trenches can have a taper of approximately 10-45 degrees from the second side of the reference magnetic layers 1005, 1040 to the first side of the reference magnetic layers 1005, 1040. In another expression, the wall angle measured from the normal axis to the horizontal direction of the reference magnetic layers 1005, 1040 can be approximately 10-45 degrees.

In aspects, the magnetic field of the reference magnetic layers 1005, 1040 can have a fixed polarization substantially parallel to a major planar orientation of the reference magnetic layers 1005, 1040, and the magnetic field of the free magnetic layers 1015, 1050 can have a polarization substantially parallel to the major planar orientation of the reference magnetic layers 1005, 1040, as illustrated in FIG. 3. The magnetic field of a given portion the free magnetic layers 1015, 1050 can be selectively switchable between being substantially parallel and substantially antiparallel to the magnetic field of the reference magnetic layers 1005, 1040. In one implementation, the magnetic field in a given portion of the first free magnetic layer 1015 can be configured to switch to being substantially parallel to the magnetic field of the first reference layer 1005 in response to a current flow in a first direction through a corresponding portion of the first conductive layer 1025, and to switch to being substantially anti-parallel to the magnetic field of the first reference layer 1005 in response to a current flow in a second direction through the corresponding portion of the first conductive layer 1025. Similarly, the magnetic field in a given portion of the second free magnetic layer 1050 can be configured to switch to being substantially parallel to the magnetic field of the second reference layer 1040 in response to a current flow in a first direction through a corresponding portion of the second conductive layer 1060, and to switch to being substantially anti-parallel to the magnetic field of the second reference layer 1040 in response to a current flow in a second direction through the corresponding portion of the second conductive layer 1060. In another implementation, the magnetic field of the reference magnetic layers 1005, 1040 can have a fixed polarization substantially perpendicular to a major planar orientation of the reference magnetic layers 1005, 1040, and the magnetic field of the free magnetic layers 1015, 1050 can have a polarization substantially perpendicular to the major planar orientation of the reference magnetic layers 1005, 1040, as illustrated in FIG. 4.

Figure 11:
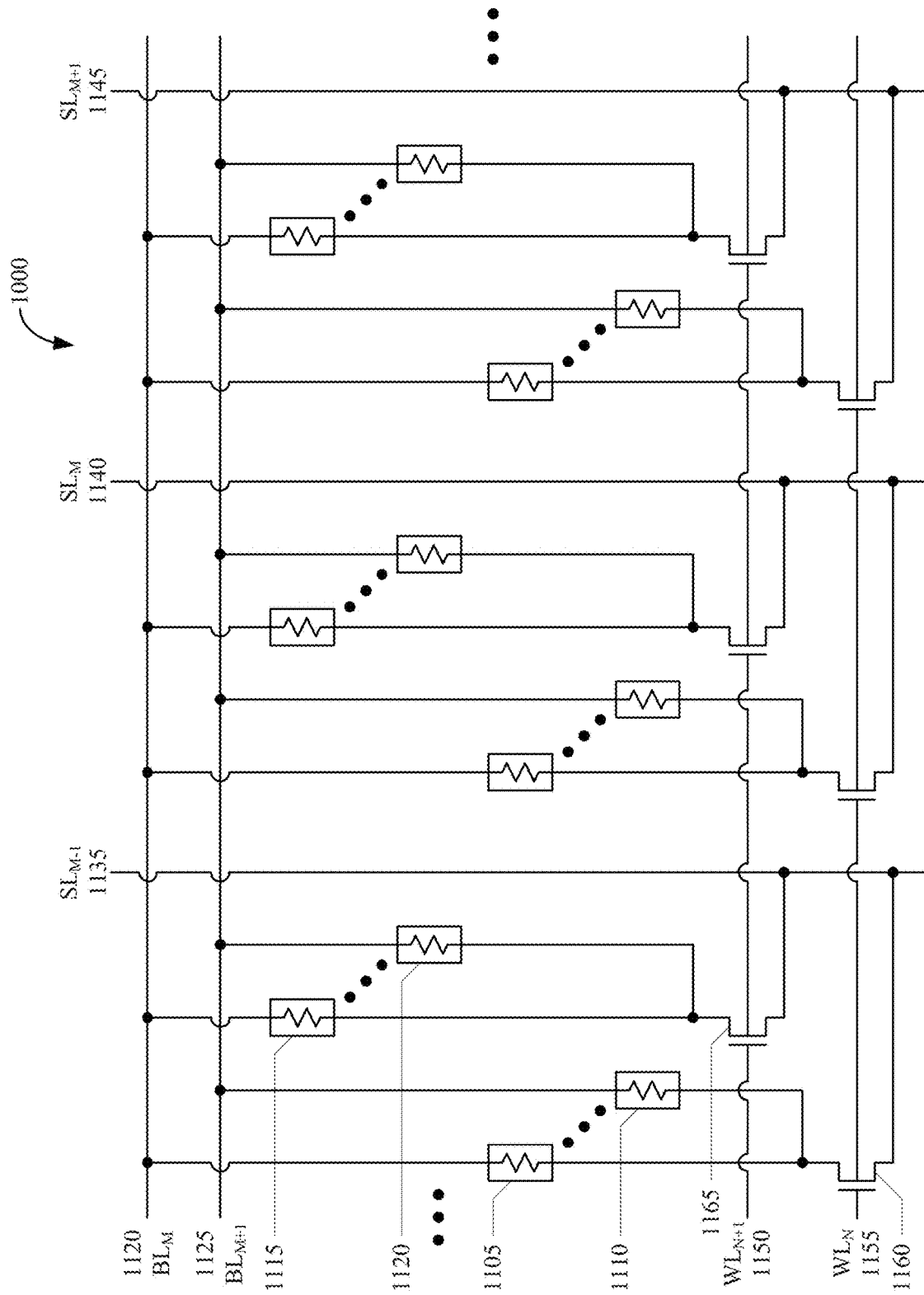
FIG. 11 shows a memory cell array, in accordance with aspects of the present technology.

Referring now to FIG. 11, the memory cell array 1000 can include a plurality of MTJ cells 1105-1120, a plurality of bit lines 1125, 1130, a plurality of source lines 1135-1145, a plurality of word lines 1150, 1155, and a plurality of select transistor 1160, 1165. The MTJ cells arranged along a string 1105, 1110 can be coupled by a corresponding select transistor 1160 to a respective source line 1135. The MTJ cells arranged along a second string 1115, 1120 in the same column can be coupled by another corresponding select transistor 1165 to the same respective source line 1135. The gate of the select transistors 1160, 1165 can be coupled to a respective word line 1150, 1155. The memory device can further include a plurality of memory cell array blocks, as described above with reference to FIGS. 7 and 9.

In one implementation, a logic '0' state can be written to a given memory cell 1105 by biasing the respective bit line 1120 at a bit line write potential (e.g., $V_{BLW}$), biasing the respective source line 1135 at a ground potential, and driving the respective word line 1155 at a word line write potential (e.g., $V_{WLW}=V_{Hi}$). The word lines for the cells that are not being written to can be biased at a ground potential. In addition, the other source lines 1140, 1145 can be biased at a high potential or held in a high impedance state. The high potential can be equal to the bit line write potential or some portion thereof. A logic '1' state can be written to the given memory cell 1105 by biasing the respective bit line 1120 at a ground potential, biasing the respective source line 1135 at a source line write potential (e.g., $V_{SLW}$), and driving the respective word line 1155 at the word line write potential (e.g., $V_{WLW}=V_{Hi}$). The word lines for the cells that are not being written to can be biased at ground potential. In addition, the other source lines 1140, 1145 can be biased at a low potential or held in a high impedance state. The state of the given memory cell 1105 can be read by biasing the respective bit line 1120 at a bit line read potential (e.g., $V_{BLR}$), biasing the respective source line 1135 at a ground potential, driving the respective word line 1155 at a word line read potential ($V_{WLR}=V_{Hi}$), and sensing the resulting current on the respective source line 1135. The word lines for the cells that are not being read can be biased at a ground potential. In addition, the other source lines 1140, 1145 can be biased at a high potential or held in a high impedance state. The high potential can be equal to the bit line read potential or some portion thereof.

Figure 12:
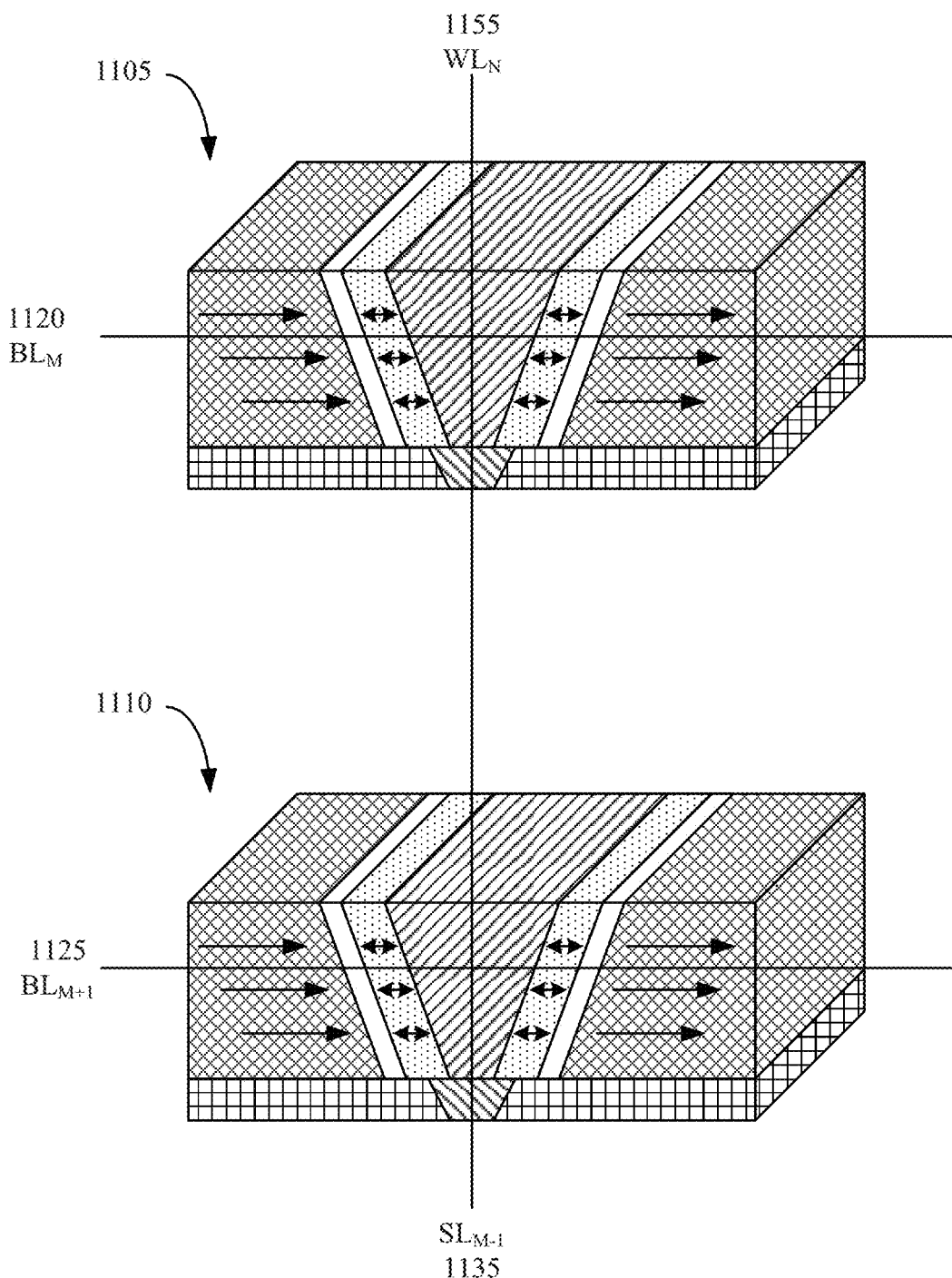
FIG. 12 shows a memory cell array, in accordance with aspects of the present technology.

Referring now to FIG. 12, two MTJ cells coupled in a string, in accordance with aspects of the present technology, is shown. When writing a '0' to a first MTJ cell 1105, the bit line 1120 can be biased at $V_{BLW}$ and the source line can be biased at ground resulting in a current that flows from the bit line 1120 and out through the source line 1135. However, the bit lines of the second MTJ cells in the same string 1110 can be biased at ground, which will result in half the current that flows into the bit line 1120 of the first MTJ cell 1105 flowing out the source line 1135 and half the current leaking out through the bit line 1125 of the second MTJ cell. By increasing the potential voltage on the bit line 1120 of the second MTJ cell 1110 or holding the bit line 1120 of the second MTJ cell 1110 in a high impedance state (e.g., floating), the leakage current can be reduced. For example, if the potential on the bit line 1125 of the second MTJ cell 1110 is increased to one half (½) of the applied to the bit line 1120 of the first MTJ cell 1105, the leakage current out through the second MTJ cell 1110 can be reduced to 25%. Similar leakage paths can be present when writing a '1' to a given MTJ cell in a string. By decreasing the potential applied to the bit lines of the other MTJ cells in the string or holding the bit lines of the other strings in a high impedance state, leakage currents through the other MTJ cells can be also be decreased.

Figure 13A:
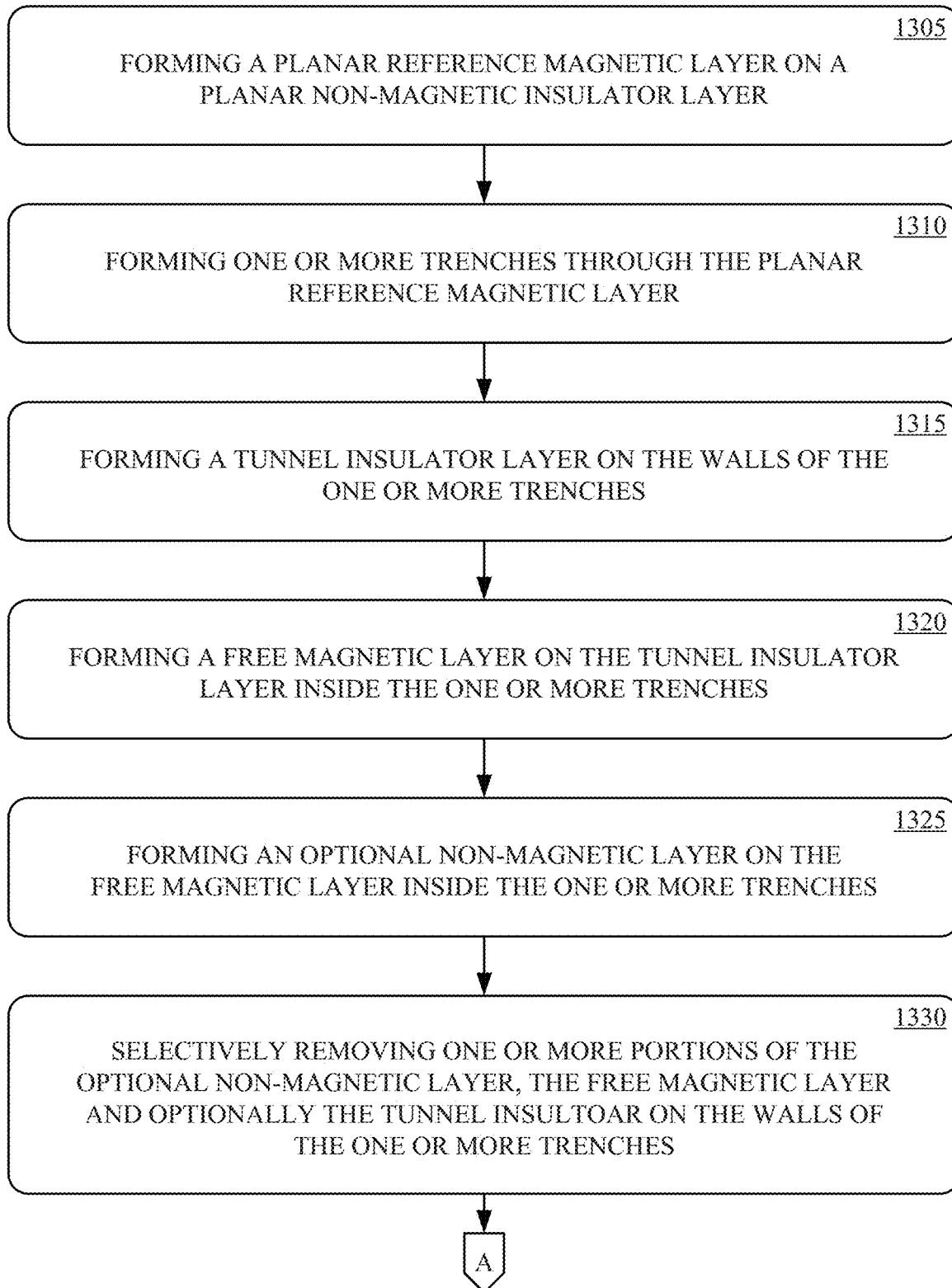

Referring now to FIGS. 13A and 13B, a method of fabricating one or more MTJs, in accordance with aspects of the present technology, is shown. The method of fabricating the one or more MTJs will be further described with reference to FIGS. 14A-14H, which show the one or more MTJs during various stage of the method of manufacturing. The method of fabrication can include forming a planar reference magnetic layer 1405 on a planar non-magnetic insulator layer 1410, at 1305. Although aspects of the present technology are described with reference to layers, it is to be appreciated that the term "layer" as used herein can refer to a uni-layer or a multi-layer. In one implementation, one or more layers Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof can be deposited on the non-magnetic insulator layer. In one implementation, the non-magnetic insulator layer can include one or more layers of Magnesium Oxide (MgO), Silicon Oxide (SiOx), Aluminum Oxide (AlOx) or alloys.

At 1310, one or more trenches 1415 can be formed in the reference magnetic layer 1405. In one implementation, the one or more trenches 1415 can be formed by Ion Beam Etching (IBE) in combination with a trench mask. In one implementation, the one or more trenches can have a taper of approximately 10-45 degrees from a top side of the reference magnetic layer 1405 to a bottom side of the reference magnetic layer 1405. In another expression, the wall angle measured from the normal axis to the horizontal direction of the planar reference magnetic layer 1405 can be approximately 10-45 degrees.

At 1315, a tunnel insulator layer 1420 can be formed on the walls of the one or more trenches 1415. At 1320, a free magnetic layer 1425 can be formed on the tunnel insulator in the one or more trenches 1415. At 1325, an optional non-magnetic layer (not shown) can be formed on the free magnetic layer 1425 in the one or more trenches 1415. In one implementation, a tunnel insulator layer 1420 can be deposited on the surface of the planar non-magnetic insulator layer 1405 including the walls of the one or more trenches 1415. The tunnel insulator layer can include one or more layers of a Magnesium Oxide (MgO), Silicon Oxide (SiOx), Aluminum Oxide (AlOx), Titanium Oxide (TiOx) or a combination of these oxide materials. A free magnetic layer 1425 can be deposited on the surface of the tunnel insulator layer 1420 inside and outside the one or more trenches 1415. The free magnetic layer 1425 can include one or more layers of a Cobalt-Iron-Boron (Co—Fe—B), Cobalt-Nickle-Iron (CoNiFe), Nickle-Iron (NiFe) alloy or their multilayer combinations. A non-magnetic layer can be deposited on the surface of the free magnetic layer 1425 inside and outside of the one or more trenches 1415. The non-magnetic layer can include one or more layers a Tantalum (Ta), Chromium (Cr), W, V, Pt, Ru, Pd, Cu, Ag, Rh, or their alloy. The materials of the tunnel insulator 1420, the free magnetic layer 1425 and the optional non-magnetic layer can be deposited by an angular deposition process to improve deposition in the one or more trenches. In other implementations, the materials of the tunnel insulator 1420, the free magnetic layer 1425 and the optional non-magnetic layer can be deposited by atomic layer deposition or Chemical Vapor Deposition (CVD). The portions of the tunnel insulator layer 1420, the free magnetic layer 1425 and the optional annular non-magnetic layer at the bottom of the one or more trenches 1415 and on top of the planar non-magnetic insular layer 1405 can be removed by one or more selective etching, milling or the like processes. Alternatively, the portions of the tunnel insulator layer 1420, the free magnetic layer 1425 and the optional non-magnetic layer at the bottom of the one or more trenches and on top of the planar non-magnetic insular layer can be removed by successive etching, milling or the like processes before the subsequent layer is deposited.

Figure 14A:
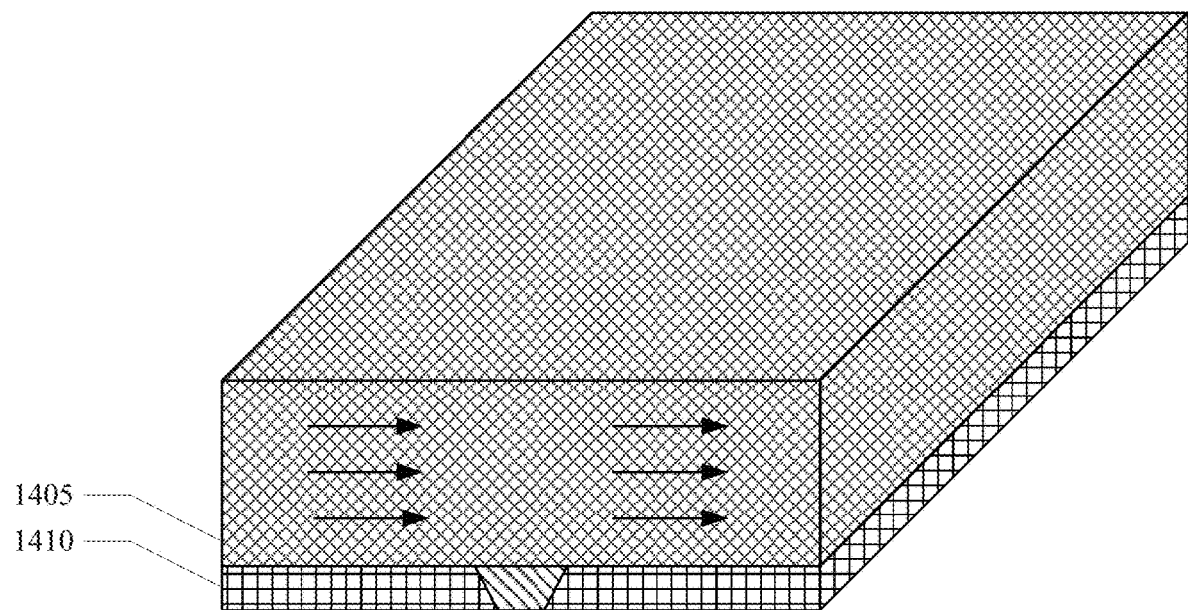
FIGS. 14A-14H shows a method of fabricating a MTJ, in accordance with aspects of the present technology.
Figure 14B:
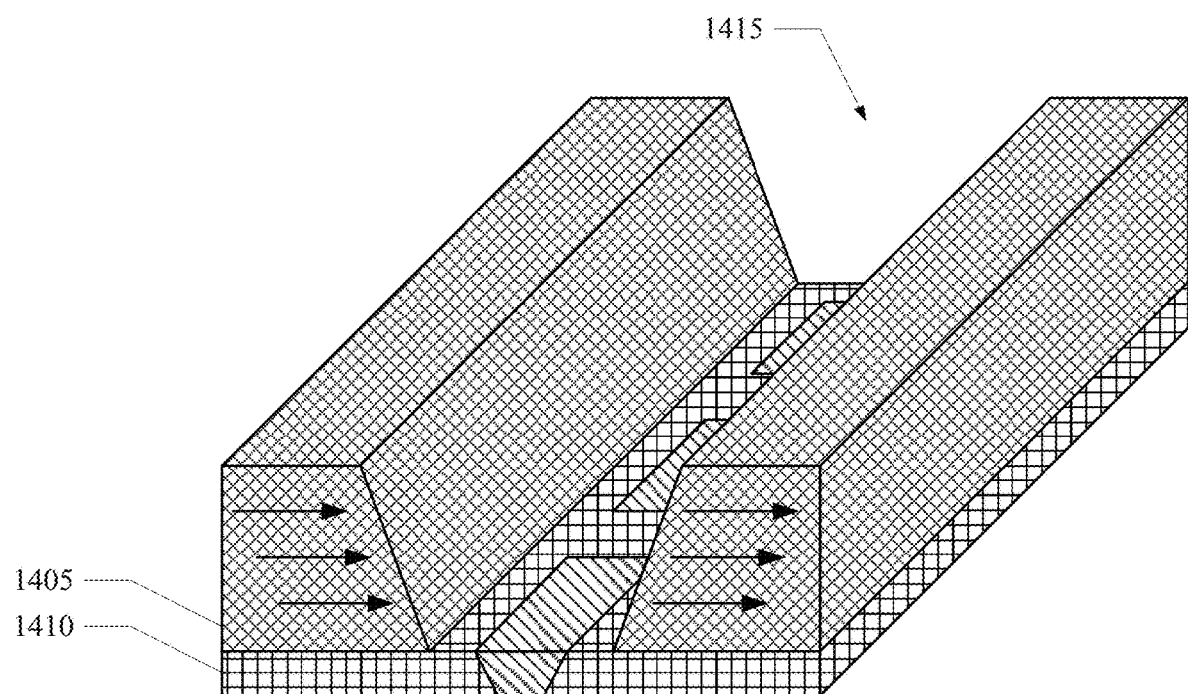
Figure 14C:
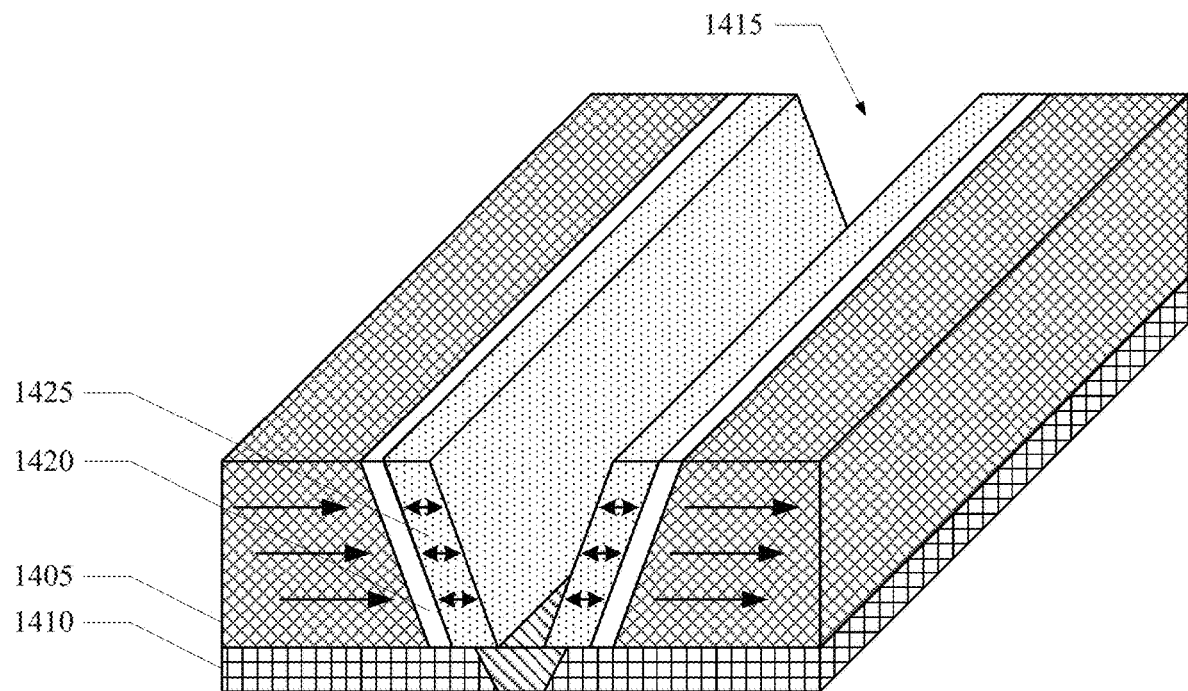

In one implementation, the magnetic field of the planar reference magnetic layer 1405 and the magnetic field of the free magnetic layer 1425 can have a polarization parallel to the major planar orientation of the planar reference magnetic layer 1405 (also referred to as in-plane), and the magnetic field of the free magnetic layer 1425 can be selectively switchable between being substantially parallel and substantially antiparallel to the magnetic field of the planar reference layer 1425, as illustrated in FIG. 14C. In another implementation, the magnetic field of the planar reference magnetic layer 1405 and the magnetic field of the free magnetic layer 1425 can have a polarization substantially perpendicular to the major planar orientation of the planar reference magnetic layer 1405 (also referred to as perpendicular-to-plane), and the magnetic field of the free magnetic layer 1425 can be selectively switchable between being substantially parallel and substantially antiparallel to the magnetic field of the planar reference layer 1405, as illustrated in FIG. 4.

Figure 14D:
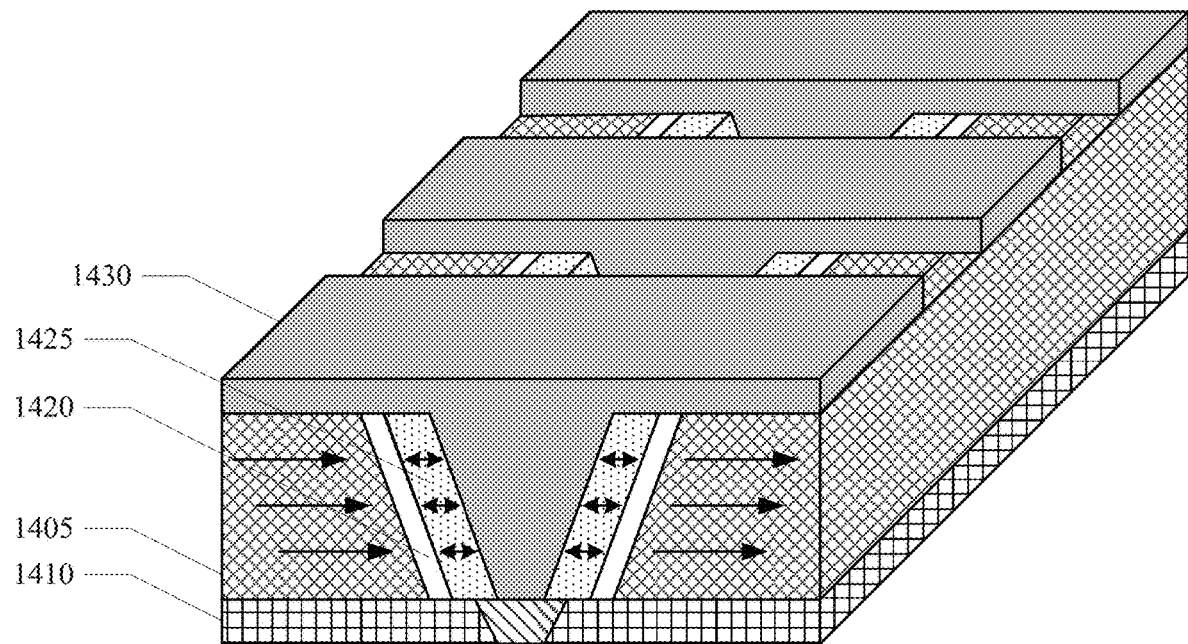
Figure 14E:
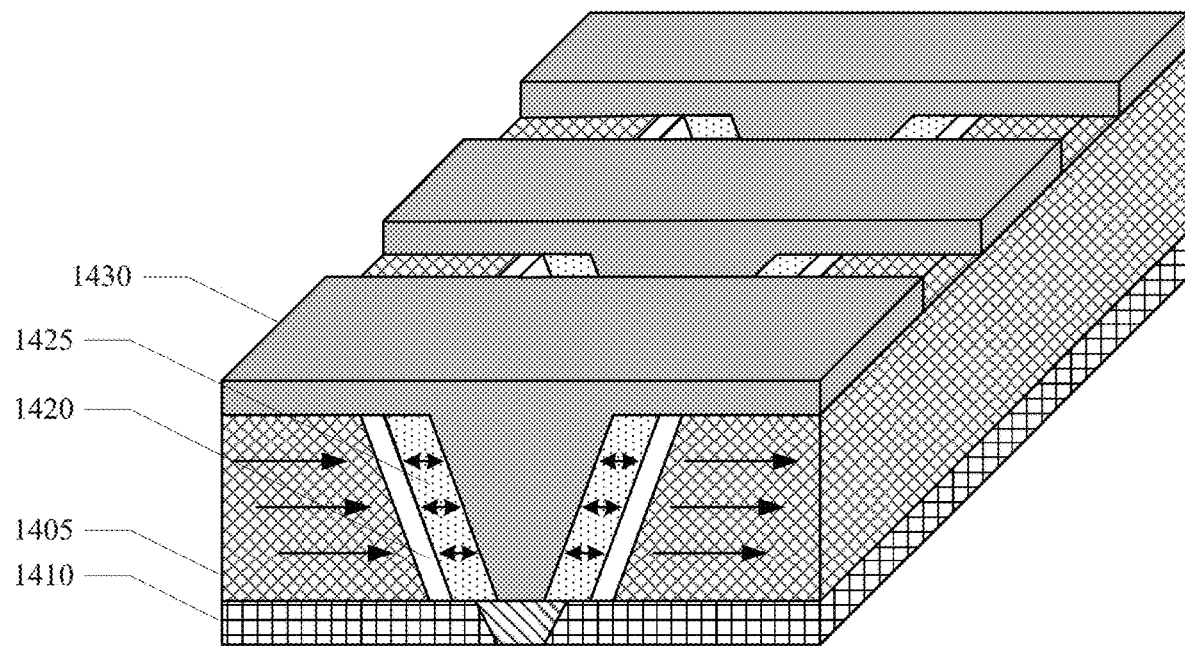

At 1330, one or more portions of the optional non-magnetic layer, one or more portions of the free magnetic layer 1425, and optionally one or more portions of the tunnel insulator layer 1420 can be removed from the walls of the one or more trenches 1415. In one implementation, an insulator block mask 1430 can be formed as illustrated in FIG. 14D, and the exposed portions of the optional non-magnetic layer, the free magnetic layer 1425, and optionally the tunnel insulator layer 1420 can be removed by ion beam milling, reactive ion etch or the like, as illustrated in FIG. 14E. In other implementation, the exposed portions of the optional non-magnetic layer and the free magnetic layer can be oxidized and nitride. In yet another implementation can be ion implanted with Gallium (Ga) or the like.

Figure 14F:
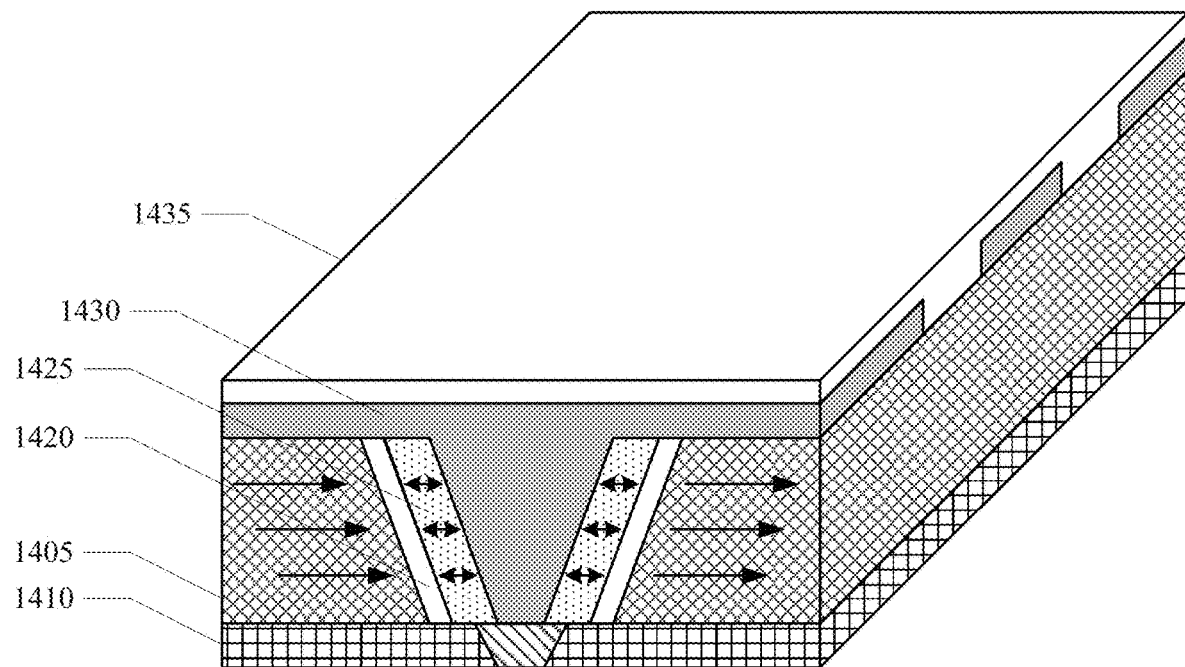
Figure 14G:
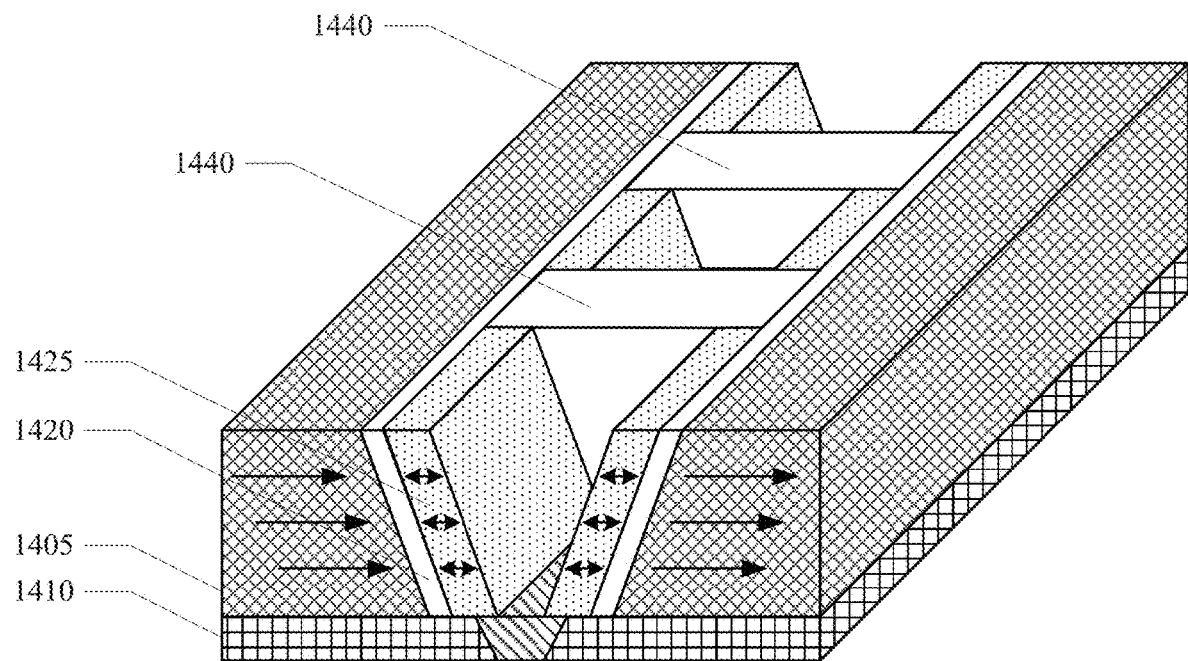

At 1335, one or more insulator blocks can be formed between the one or more portions of the optional non-magnetic layer, the one or more portions of the free magnetic layer 1425 and optionally the one or more portions of the tunnel insulator 1420 in the one or more trenches. In one implementation, a layer of an insulator 1435 such a Magnesium Oxide (MgO), Silicon Oxide (SiOx), Aluminum Oxide (AlOx), Titanium Oxide (TiOx) or a combination of these oxide materials can be deposited. The insulator layer 1435 can be deposited in the portions of the one or more trenches exposed by the insulator block mask 1430 and over the surface of the insulator block mask 1430, as illustrated in FIG. 14F. In one implementation, a processes such as Chemical Mechanical Polishing (CMP) can be used to remove the excess portion of the one or more insulator layers outside the exposed portions of the one or more trenches, and then a resist stripping process can be utilized to remove the insulator block mask, as illustrated in FIG. 14G.

Figure 14H:
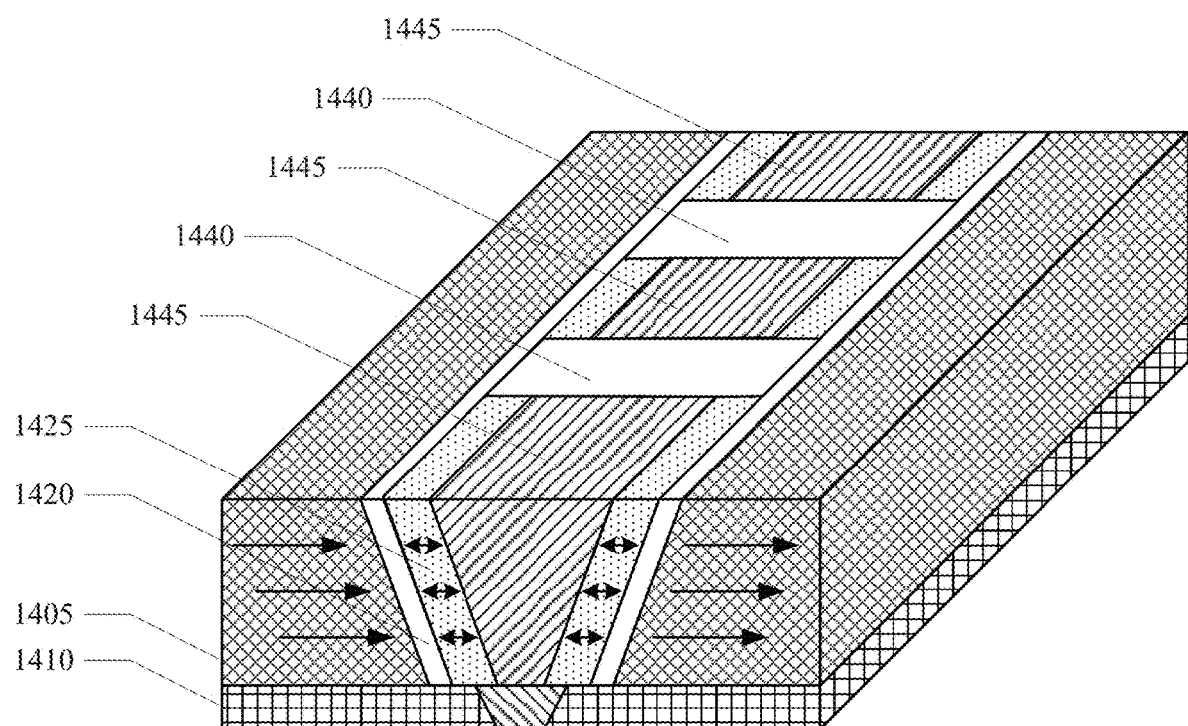

At 1340, one or more conductive cores 1445 can be formed between the one or more insulator blocks 1440, and between the one or more portions of the free magnetic layer 1425, or the optional non-magnetic layer if applicable, in the one or more trenches, as illustrated in FIG. 14H. In one implementation, a metal seed layer can be deposited on the exposed portions of the free magnetic layer, or the optional non-magnetic layer if applicable, between the one or more insulator blocks. A conductor layer, such as Copper (Cu) can be deposited by a process such as Chemical Vapor Deposition (CVD) on the metal seed layer to form the one or more conductive cores.

The respective portions of the reference magnetic layer 1405, the tunnel insulator 1420, the free magnetic layer 1425, the optional non-magnetic layer and the conductive cores 1445 between sets of insulator blocks 1440 form corresponding MTJ cells. In addition, the processes of 1305-1340 can optionally be repeated a plurality of times to form strings of MTJs as illustrated in FIG. 10.

Figure 15A:
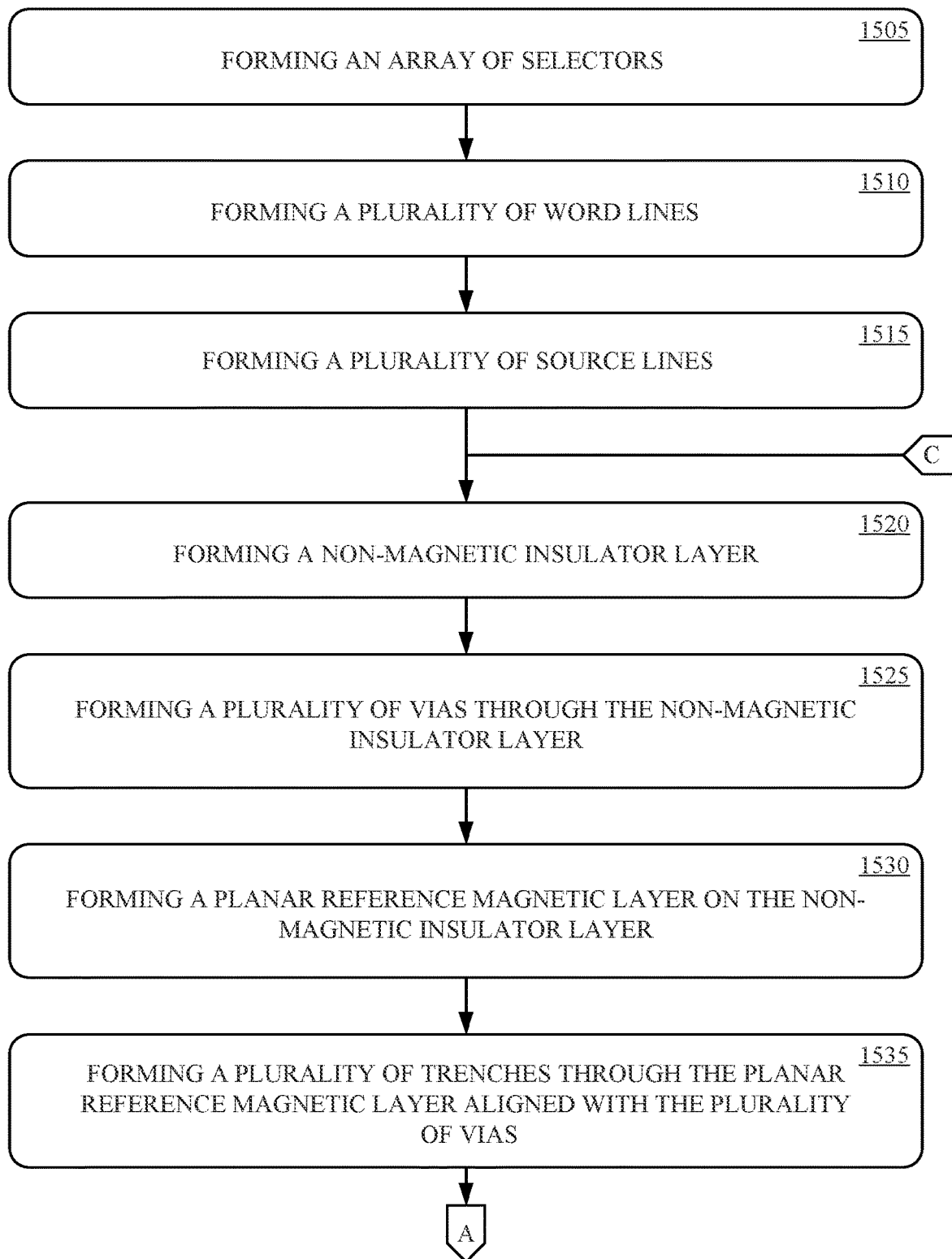
FIGS. 15A-15C shows a method of fabricating a MTJ, in accordance with aspects of the present technology.
Figure 15B:
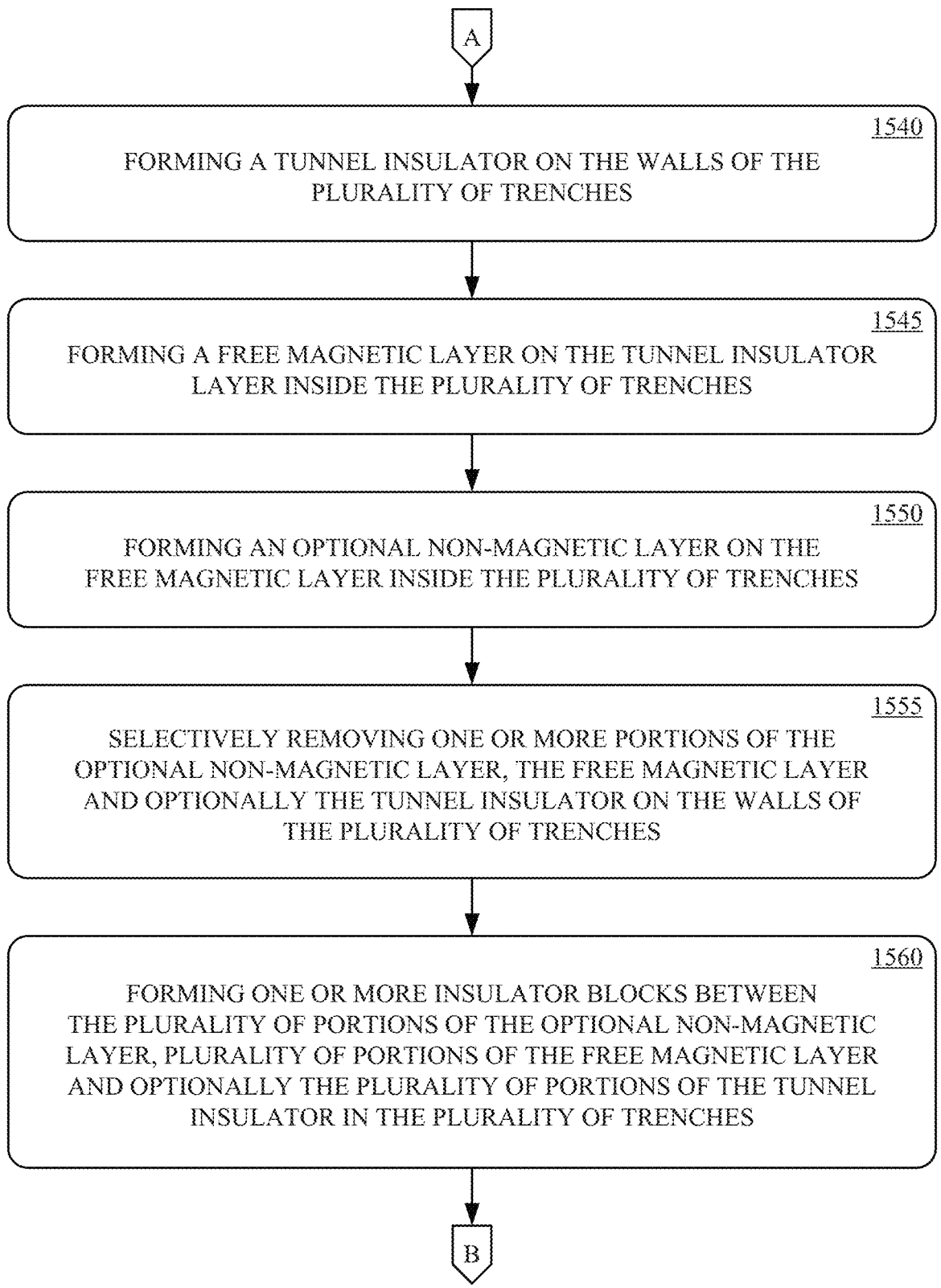
Figure 15C:
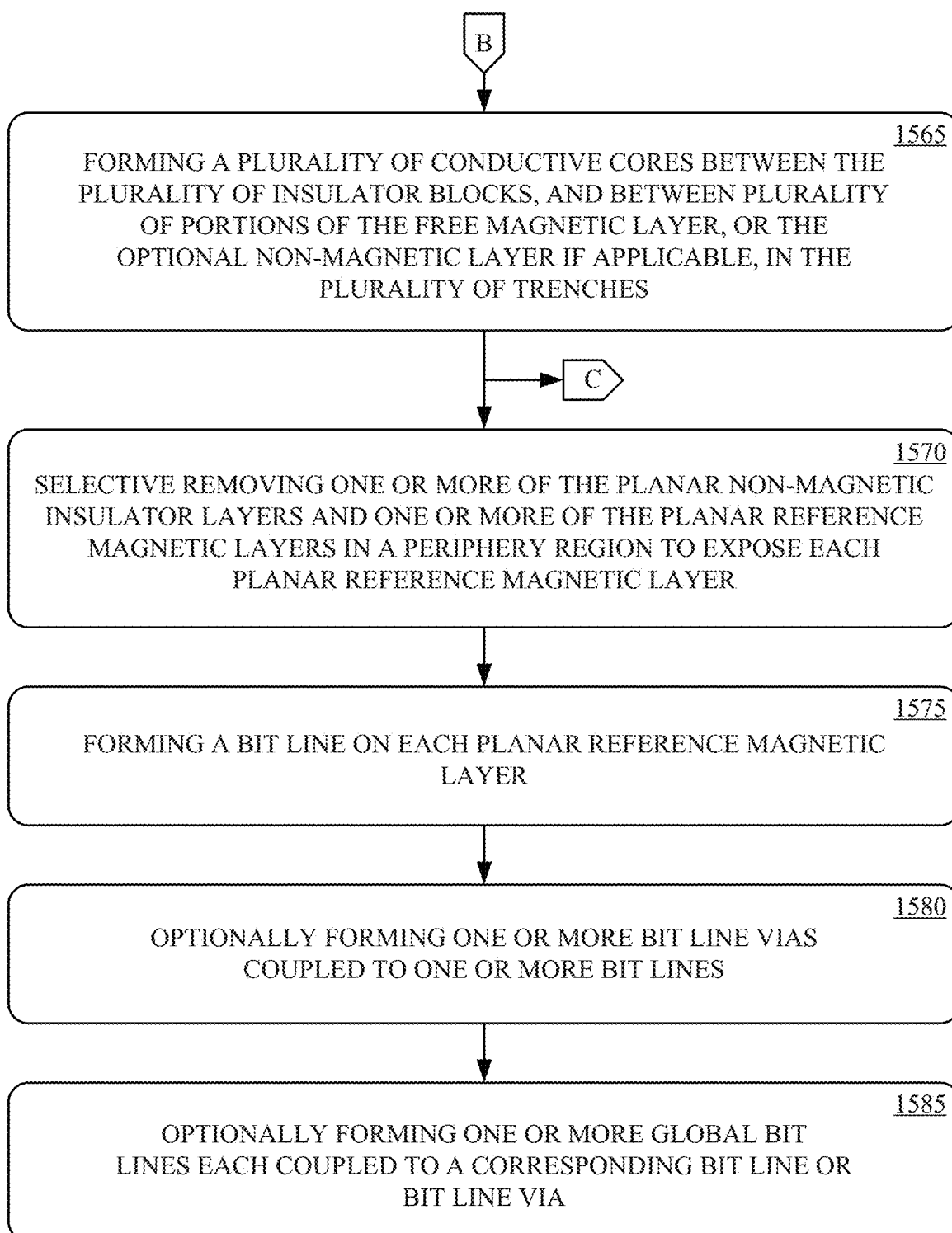

Referring now to FIGS. 15A-15C, a method of fabricating a memory cell array, in accordance with aspects of the present technology, is shown. The method of fabricating the memory cell array will be further described with reference to FIGS. 16A-16F, which show the memory cell array during various stage of the method of manufacturing. The method of fabrication can include forming an array of selectors 1602 on a substrate, at 1505. There are numerous methods of fabrication that can be utilized for the array of selectors. The specific selector and processes are not germane to an understanding of aspects of the present technology and therefore will not be described in further detail.

At 1510, a plurality of word lines 1604 can be formed on a substrate and coupled to the selectors in respective rows. In one implementation, a conductive layer can be deposited on a substrate. A word line pattern mask can be formed on the conductive layer and a selective etching process can be performed to remove the portions of the conductive layer exposed by the word line pattern mask to form the plurality of word lines coupled to the selectors. In another embodiment, a word line can be formed by electro-plating on to the framed photo-resist pattern that has a vacancy for word line portion. The word lines can be disposed as a plurality of substantially parallel traces in a first direction (e.g., rows) of the substrate. There are numerous conductive materials that can be utilized for the word lines, and there are numerous deposition, masking, etching, photoresist-framing, and electro-plating process that can be utilized for forming the plurality of word lines. The specific materials and processes are not germane to an understanding of aspects of the present technology and therefore will not be described in further detail.

At 1515, a plurality of source lines 1606 can be formed on the substrate and coupled to the selectors in respective columns. In one implementation, an insulator layer can be formed over the plurality of word lines, and a second conductive layer can be deposited over the insulator layer. A source line pattern mask can be formed on the second conductive layer a selective etching process can be performed to remove the portions of the second conductive layer exposed by the word line pattern mask to form the plurality of source lines. The source lines can be disposed as a plurality of substantially parallel traces in a second direction (e.g., columns) on the substrate that is perpendicular to the first direction of the word lines. There are numerous conductive materials that can be utilized for the source lines, and there are numerous deposition, masking, etching, photoresist-framing, and electro-plating process that can be utilized for forming the plurality of source lines. The specific materials and processes are not germane to an understanding of aspects of the present technology and therefore will not be described in further detail.

At 1520, one or more planar non-magnetic insulator layers 1608 can be deposited on the plurality of selectors. In one implementation, one or more layers of Magnesium Oxide (MgO), Silicon Oxide (SiOx), Aluminum Oxide (AlOx) or alloys thereof can be deposited on the plurality of selectors. At 1525, a plurality of vias 1610 can be formed through the first planar non-magnetic insulator layer. There are numerous conductive materials that can be utilized for the plurality of vias through the one or more planar non-magnetic insulator layer, and there are numerous deposition, masking, and etching process that can be utilized for forming the plurality of vias. The specific materials and processes are not germane to an understanding of aspects of the present technology and therefore will not be described in further detail.

At 1530, one or more planar reference magnetic layers 1612 can be deposited on the one or more non-magnetic insulator layers 1610. In one implementation, one or more layers Cobalt-Iron-Boron (Co—Fe—B) alloy, a Cobalt-Iron (CoFe) alloy, a Cobalt-Iron-Nickle (CoFeNi) alloy, an Iron-Nickle (FeNi) ahoy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof can be deposited on the one or more non-magnetic insulator layers.

At 1535, a plurality of trenches 1614 can be formed through the one or more reference magnetic layers 1612. The trenches 1614 can be aligned the plurality of vias 1610 In one implementation, the one or more trenches can be formed by Ion Beam Etching (IBE) in combination with a trench mask. In one implementation, the one or more trenches can have a taper of approximately 10-45 degrees from a top side of the reference magnetic layer to a bottom side of the reference magnetic layer. In another expression, the wall angle measured from the normal axis to the horizontal direction of the planar reference magnetic layer can be approximately 10-45 degrees.

At 1540, a plurality of portions of tunnel insulators can be formed on the walls of the one or more trenches. At 1545, a plurality of portions of free magnetic layer can be formed on the plurality of portions of tunnel insulators in the plurality of trenches. At 1550, a plurality of portions of optional non-magnetic layer can be formed on the free magnetic layer in the one or more trenches. In one implementation, a tunnel insulator layer 1616 can be deposited on the surface of the planar non-magnetic insulator layer 1612 and the walls of the one or more trenches 1614. The tunnel insulator layer 116 can include one or more layers of a Magnesium Oxide (MgO), Silicon Oxide (SiOx), Aluminum Oxide (AlOx), Titanium Oxide (TiOx) or a combination of these oxide materials. A free magnetic layer 1618 can be deposited on the surface of the tunnel insulator layer 1616 inside and outside the one or more trenches 1614. The free magnetic layer 1618 can include one or more layers of a Cobalt-Iron-Boron (Co—Fe—B), Cobalt-Nickle-Iron (CoNiFe), Nickle-Iron (NiFe) alloy or their multilayer combinations. An optional non-magnetic layer 1620 can be deposited on the surface of the free magnetic layer 1618 inside and outside of the one or more trenches 1614. The non-magnetic layer 1620 can include one or more layers a Tantalum (Ta), Chromium (Cr), W, V, Pt, Ru, Pd, Cu, Ag, Rh, or their alloy. The materials of the tunnel insulator 1616, the free magnetic layer 1618 and the optional non-magnetic layer 1620 can be deposited by an angular deposition process to improve deposition in the one or more trenches 1614. In other implementations, the materials of the tunnel insulator 1616, the free magnetic layer 1618 and the optional non-magnetic layer 1620 can be deposited by atomic layer deposition or Chemical Vapor Deposition (CVD). The portions of the tunnel insulator layer 1616, the free magnetic layer 1618 and the optional non-magnetic layer 1620 at the bottom of the one or more trenches 1614 and on top of the planar reference magnetic layer 1612 can be removed by one or more selective etching, milling or the like processes. Alternatively, the portions of the tunnel insulator layer 1616, the free magnetic layer 1618 and the optional non-magnetic layer 1620 at the bottom of the one or more trenches 1614 and on top of the planar reference magnetic layer 1612 can be removed by successive etching, milling or the like processes before the subsequent layer is deposited. It is to be appreciated that the thickness along a vertical axis of the free magnetic layer 1618 or the optional non-magnetic layer 1620 is thinner in the horizontal portions at the bottom of the trenches 1614 and on top of the planar reference magnetic layer 1612 as compared to the portions along the walls of the trenches 1614. Therefore, the free magnetic layer 1618 or the optional non-magnetic layer 1620 at the bottom of the one or more trenches 1614 and on top of the planar reference magnetic layer 1612 can be removed, while the free magnetic layer 1618 or the optional non-magnetic layer 1620 is only thinned.

In one implementation, the magnetic field of the reference magnetic layer and the magnetic field of the free magnetic layer can have a polarization parallel to the major planar orientation of the planar reference magnetic layer (also referred to as in-plane), and the magnetic field of the free magnetic layer can be selectively switchable between being substantially parallel and substantially antiparallel to the magnetic field of the planar reference layer. In another implementation, the magnetic field of the reference magnetic layer and the magnetic field of the free magnetic layer can have a polarization substantially perpendicular to the major planar orientation of the planar reference magnetic layer (also referred to as perpendicular-to-plane), and the magnetic field of the free magnetic layer can be selectively switchable between being substantially parallel and substantially antiparallel to the magnetic field of the planar reference layer.

Figure 16A:
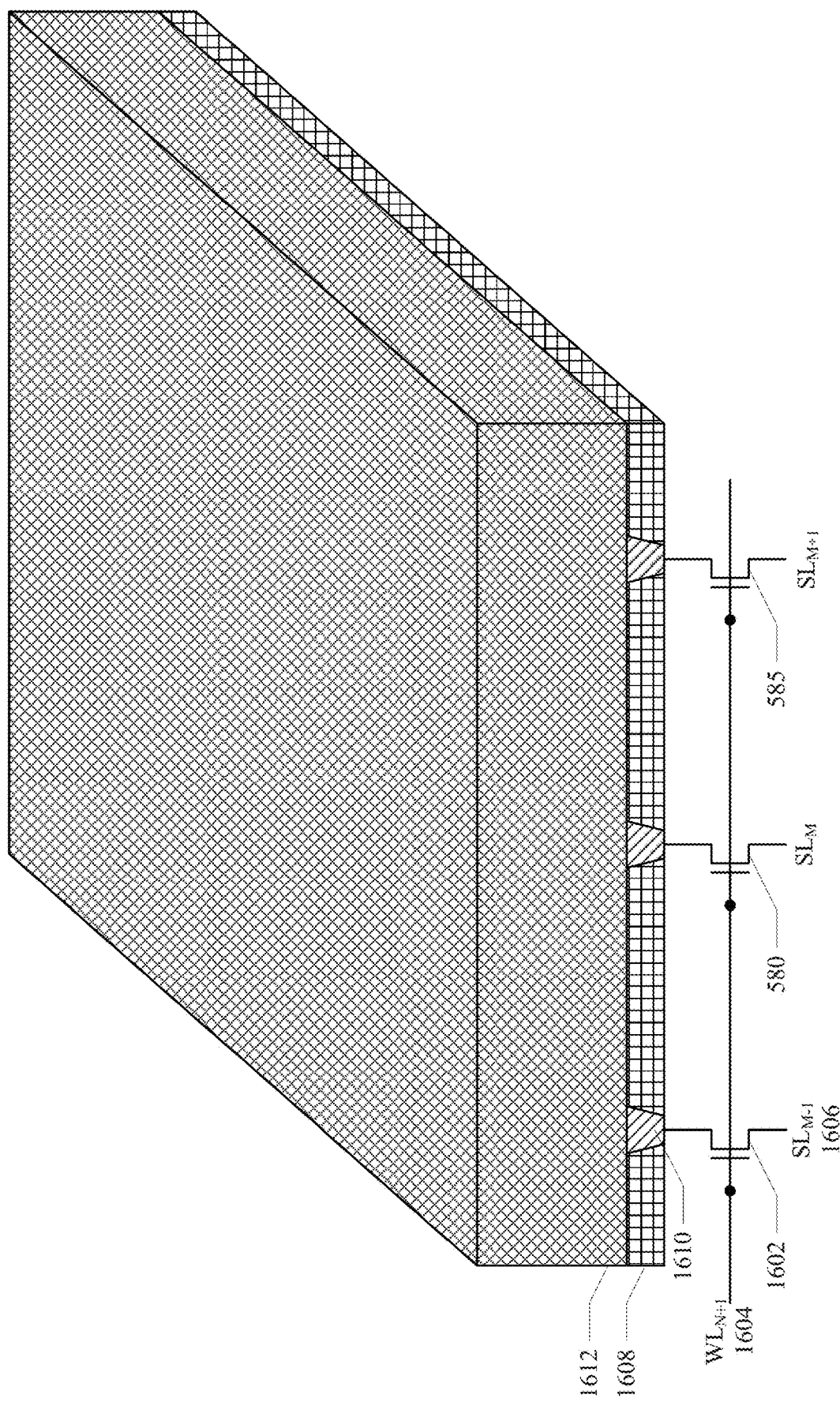
FIGS. 16A-16F shows a method of fabricating a MTJ, in accordance with aspects of the present technology.
Figure 16B:
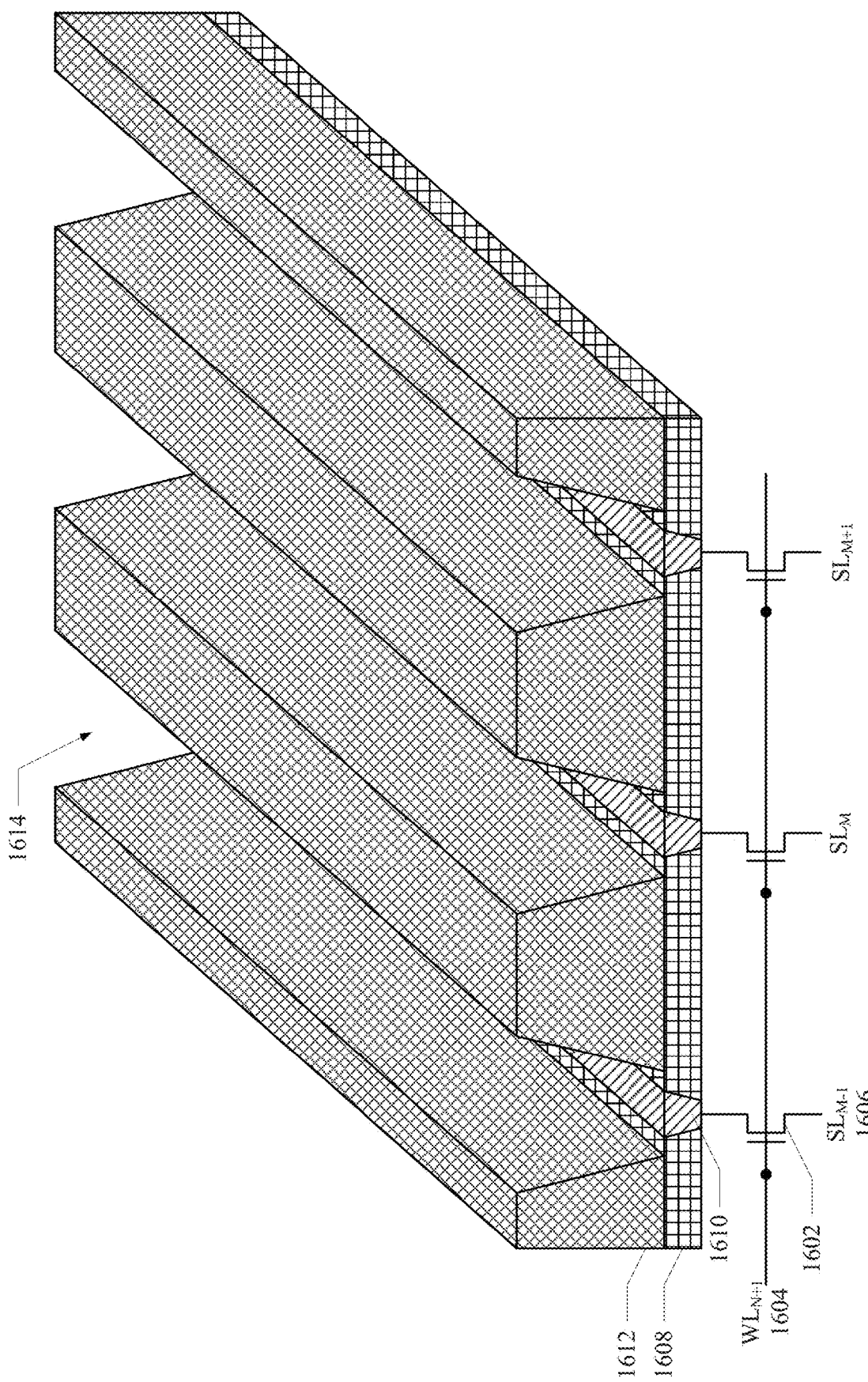
Figure 16C:
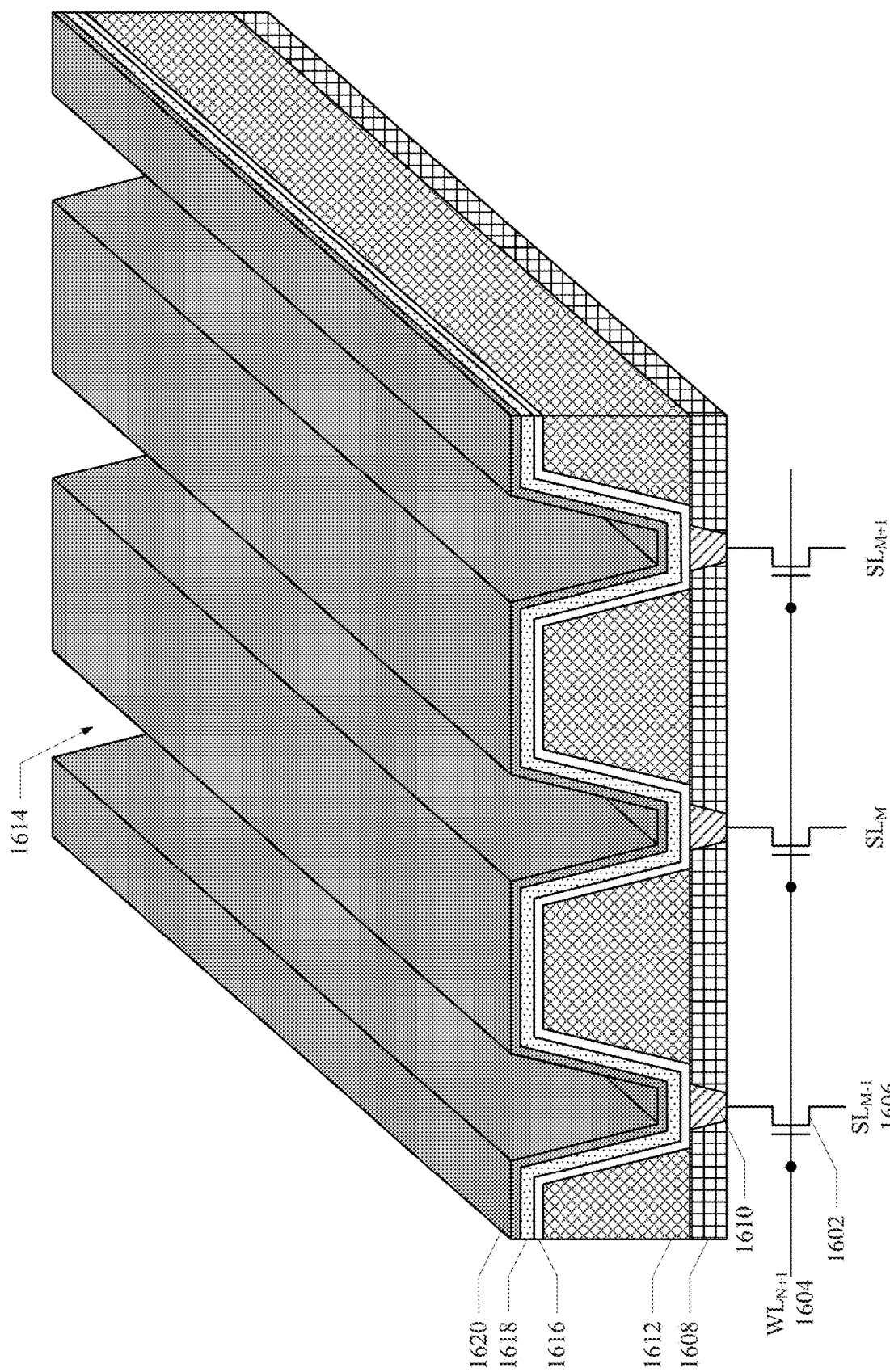
Figure 16D:
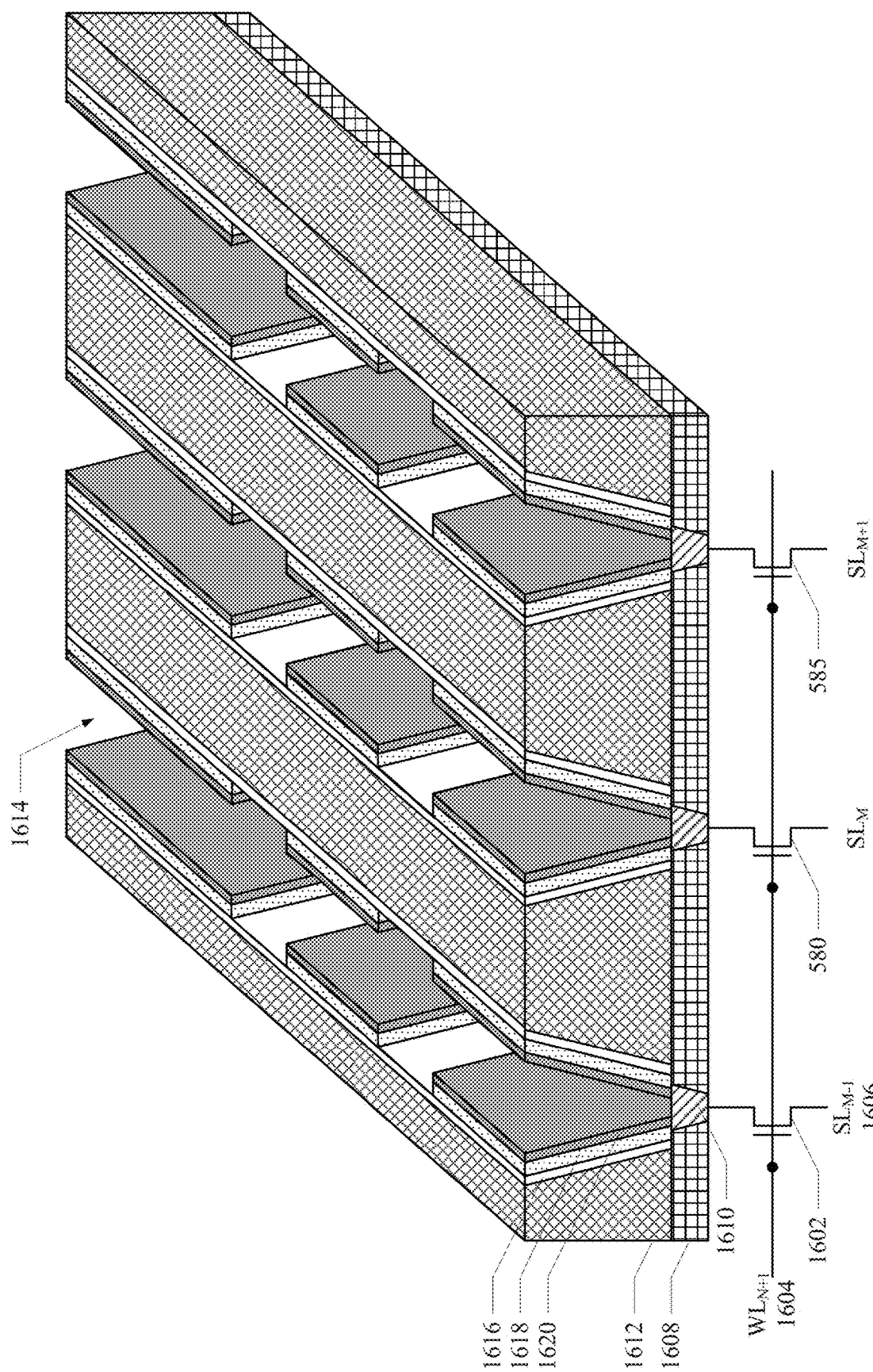

At 1555, one or more portions of the optional non-magnetic layer 1620, one or more portions of the free magnetic layer 1618, and optionally one or more portions of the tunnel insulator layer 1616 can be selectively removed from the walls of the plurality of trenches 1614. In one implementation, an insulator block mask can be formed, and the exposed portions of the optional non-magnetic layer 1620, the free magnetic layer 1618, and optionally the tunnel insulator layer 1616 can be removed by ion beam milling, reactive ion etch or the like. In other implementation, the exposed portions of the optional non-magnetic layer and the free magnetic layer can be oxidized and nitride. In yet another implementation can be ion implanted with Gallium (Ga) or the like. For reference, FIG. 16D illustrates the plurality of portions of the optional non-magnetic layer 1620 and the plurality of portions of the free magnetic layer 1618 without the insulator block mask disposed over them as shown illustrated in the similar structure in FIGS. 14D-14F so that the structure of the formed plurality of portions of the optional non-magnetic layer 1620 and the plurality of portions of the free magnetic layer 1618 can be seen. However, the insulator block mask typically cover the plurality of portions of the optional non-magnetic layer 1620 and the plurality of portions of the free magnetic layer 1618 until after formation of the plurality of insulator blocks formed subsequent processes.

Figure 16E:
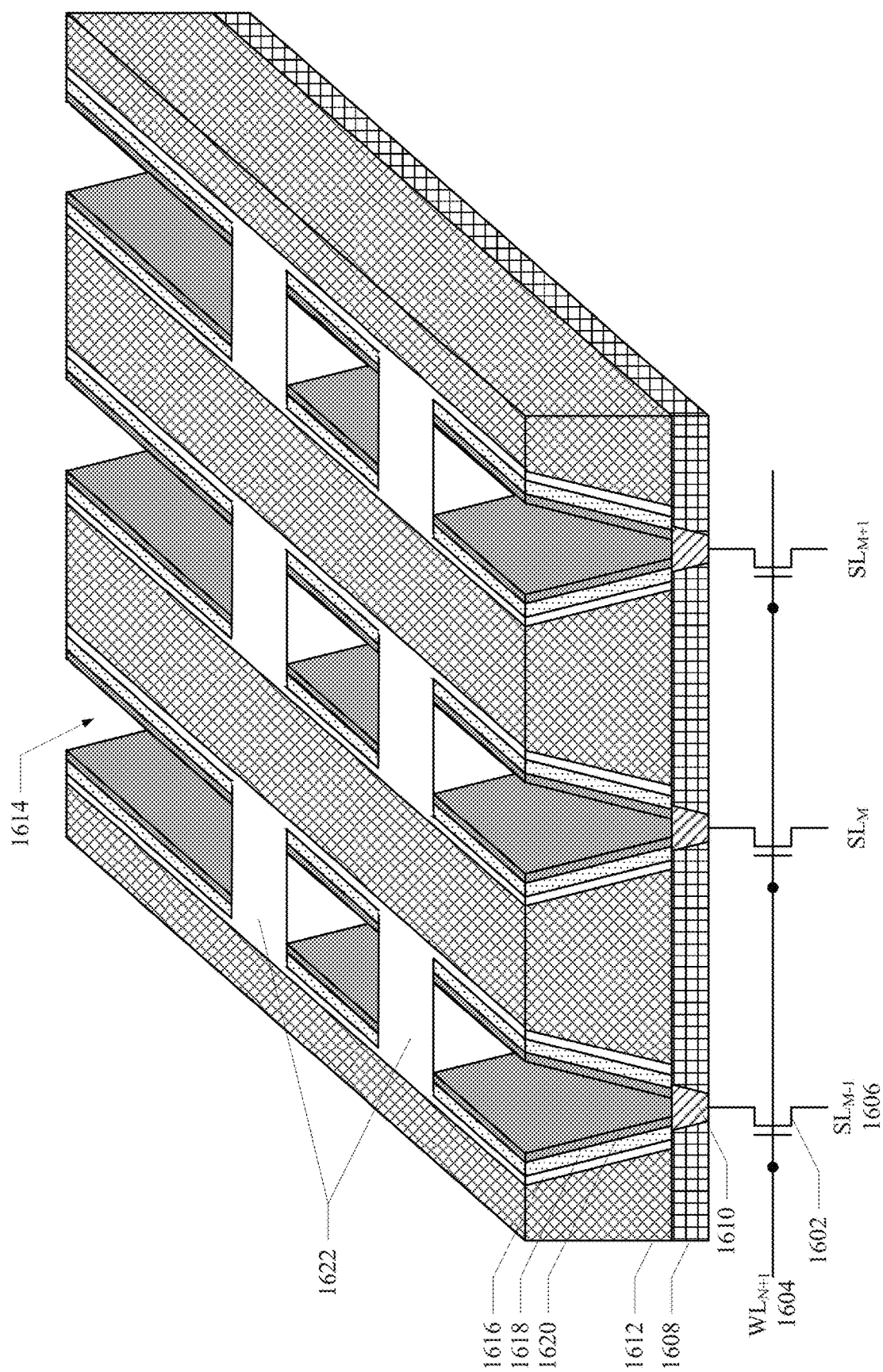

At 1560, a plurality of insulator blocks 1622 can be formed between the plurality of portions of the optional non-magnetic layer 1620, the plurality of portions of the free magnetic layer 1618 and optionally the plurality of portions of the tunnel insulator 1616 in the plurality of trenches 1614 as illustrated in FIG. 16E. In one implementation, one or more layer of an insulator such a Magnesium Oxide (MgO), Silicon Oxide (SiOx), Aluminum Oxide (AlOx), Titanium Oxide (TiOx) or a combination of these oxide materials can be deposited. The one or more insulator layers can be deposited in the portions of the trenches exposed by the insulator block mask and over the surface of the insulator block mask. In one implementation, a processes such as Chemical Mechanical Polishing (CMP) can be used to remove the excess portion of the one or more insulator layers outside the exposed portions of the one or more trenches, and then a resist stripping process can be utilized to remove the insulator block mask.

Figure 16F:
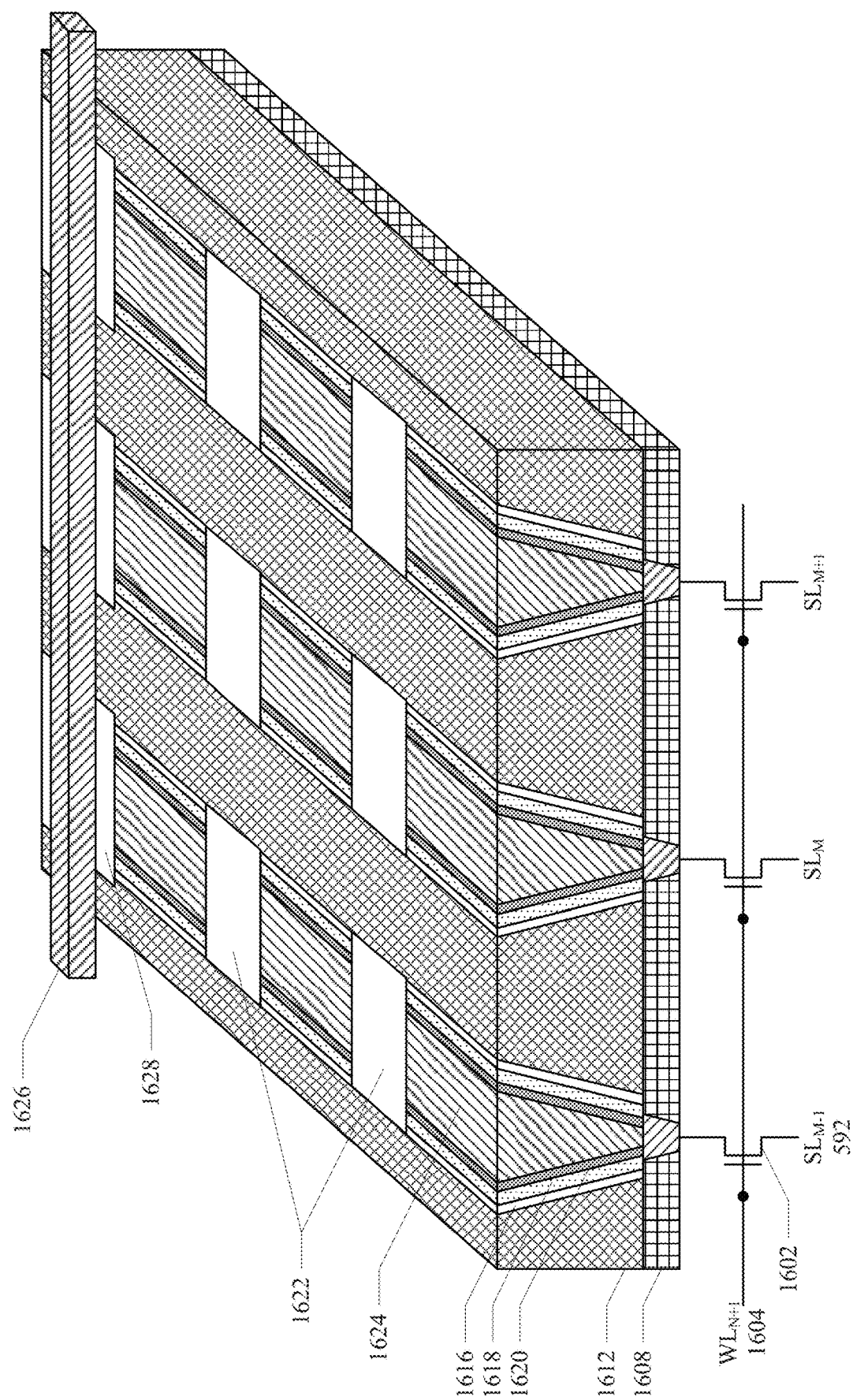

At 1565, a plurality of conductive core 1624 can be formed between the one or more insulator blocks, and between the free magnetic layer or the optional non-magnetic layer if applicable, in the one or more trenches, as illustrated in FIG. 16F. In one implementation a metal seed layer can be deposited on the exposed portions of the free magnetic layer, or the optional non-magnetic layer if applicable, between the one or more insulator blocks. A conductor layer, such as Copper (Cu) can be deposited by a process such as Chemical Vapor Deposition (CVD) on the metal seed layer to form the one or more conductive cores. The processes of 1520 through 1565 can optionally be repeated a plurality of times to form a suing of MTJs as illustrated in FIG. 10.

At 1570, portions of one or more planar non-magnetic insulator layers and one or more planar reference magnetic layers can be removed in a periphery region to expose each planar reference magnetic layer. The periphery region can be outside the array of annular openings. In one implementation, a series of one or more etching, milling or the like processes can be used to step down through the planar non-magnetic insulator layers and the planar reference magnetic layers. At 1575, a bit line 1626 can be formed on each planar reference magnetic layer 1612. In one implementation, an insulator layer can be deposited in the periphery region, and a bit line insulator patch mask can be formed from the insulator layer. A selective etching process can be performed to remove the portions of the insulator layer on the free magnetic layer, the optional non-magnetic layer and the conductive core layer in the periphery region exposed by the bit line insulator patch mask to form one or more bit line insulator patches 1628. A conductive layer can be deposited on the reference magnetic layer, while electrically isolated from on the free magnetic layer, the optional non-magnetic layer and the conductive core layer the by the insulator patches. A bit line pattern mask can be formed on the conductive layer and a selective etching process can be performed to remove the portions of the conductive layer exposed by the bit line pattern mask to form the plurality of bit lines on corresponding ones of the planar reference magnetic layers. In another implementation, a photo-resist frame is made by photo process before depositing a bit line material. The photo-resist frame has an opening to form a bit line inside. The electric-plating process is used to form a metal bit line inside the photo-resist frame. After the electrical plating process, the photo-resist frame is removed. The bit lines can be disposed as a plurality of substantially parallel traces in a first direction (e.g., rows) on respective planar reference magnetic layers.

At 1580, one or more bit line vias can optionally be formed. The one or more bit line vias can be coupled to respective bit lines. There are numerous conductive materials that can be utilized for the bit line vias, and there are numerous deposition, masking, and etching process that can be utilized for forming the plurality of bit line vias. The specific materials and processes are not germane to an understanding of aspects of the present technology and therefore will not be described in further detail.

At 1585, one or more global bit lines can be formed. The one or more global bit lines can be coupled to corresponding bit lines or bit line vias, as illustrated in FIG. 7. In one implementation, two or more bit lines arranged in respective columns can be coupled together by a corresponding global bit line. There are numerous conductive materials that can be utilized for the global bit lines, and there are numerous deposition, masking, and etching process that can be utilized for forming the plurality of global bit lines. The specific materials and processes are not germane to an understanding of aspects of the present technology and therefore will not be described in further detail.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A device comprising a memory cell array including a plurality of levels of Magnetic Tunnel Junction (MTJ) cells, each level of MTJ cells comprising:

a reference magnetic layer including a plurality of trenches extending along a first direction within the reference magnetic layer;

a plurality of sections of a tunnel barrier layer disposed on sidewalls of the trenches within the reference magnetic layer;

a plurality of sections of a free magnetic layer disposed on corresponding sections of the tunnel barrier layer in the trenches within the reference magnetic layer;

a plurality of sections of a conductive layer disposed on corresponding section of the free magnetic layer in the trenches within the reference magnetic layer;

a plurality of insulator blocks disposed in the trenches within the reference magnetic layer, each insulator block being formed between adjacent sections of the tunnel barrier layer, the free magnetic layer and the conductive layer; and an insulator layer provided on a first side of the reference magnetic layer and a plurality of interconnects formed therein, each interconnect being coupled to a corresponding section of the conductor layer formed in the trenches.

2. The device of claim 1, wherein each level of MTJ cells further comprising:

a plurality of sections of a non-magnetic capping layer disposed between sections of the free magnetic layer and sections of the conductive layer in the trenches.

3. The device of claim 1, wherein the insulator blocks separate each of the tunnel barrier layer, the free magnetic layer, and the conductive layer into the plurality of respective sections.

4. The device of claim 1, further comprising:

a plurality of bit lines disposed on the reference magnetic layer, across one or more of the insulator blocks, and isolated from the tunnel barrier layer, the free magnetic layer, and the conductive layer.

5. The device of claim 1, wherein each of the trenches has a taper of 10-45 degrees from a second side of the reference magnetic layer to a first side of the reference magnetic layer.

6. The device of claim 1, wherein:

the free magnetic layer comprises a Cobalt-Iron-Boron (Co—Fe—B) alloy;

the conductive layer comprises one or more of Copper (Cu), copper alloy, Aluminum (Al), aluminum alloy, Ruthenium (Ru) or ruthenium alloy;

the tunnel barrier layer comprises one or more of a Magnesium Oxide (MgO), Silicon Oxide (SiOx), Aluminum Oxide (AlOx) or Titanium Oxide (TiOx); and the reference magnetic layer comprises a Cobalt-Iron-Boron (Co—Fe—B) alloy.

7. The device of claim 1, wherein:

the free magnetic layer has a thickness of 1-10 nm;

the conductive layer has a thickness of 5-20 nm;

the tunnel barrier layer has a thickness of 0.2-2.0 nm; and the reference magnetic layer has a thickness of 1-20 nm.

8. The device of claim 1, wherein:

a magnetic field of the reference magnetic layer has a fixed polarization substantially parallel to a major planar orientation of the reference magnetic layer; and a magnetic field of the free magnetic layer has a polarization substantially parallel to the major planar orientation of the reference magnetic layer and selectively switchable between being substantially parallel and substantially antiparallel to the magnetic field of the reference magnetic layer.

9. The device of claim 8, wherein the magnetic field of the free magnetic layer is configured to switch to being substantially parallel to the magnetic field of the reference magnetic layer in response to a current flow in a first direction through the conductive layer and to switch to being substantially anti-parallel to the magnetic field of the reference magnetic layer in response to a current flow in a second direction through the conductive layer.

10. The device of claim 1, wherein:

a magnetic field of the reference magnetic layer has a fixed polarization substantially perpendicular to a major planar orientation of the reference magnetic layer; and a magnetic field of the free magnetic layer has a polarization substantially perpendicular to the major planar orientation of the reference magnetic layer and selectively switchable between being substantially parallel and substantially antiparallel to the magnetic field of the reference magnetic layer.

11. The device of claim 10, wherein the magnetic field of the free magnetic layer is configured to switch to being substantially parallel to the magnetic field of the reference magnetic layer in response to a current flow in a first direction through the conductive layer and to switch to being substantially anti-parallel to the magnetic field of the reference magnetic layer in response to a current flow in a second direction through the conductive layer.

12. The device of claim 1, wherein a section of the tunnel barrier layer, a corresponding section of the free magnetic layer and a corresponding section of the conductive layer disposed between adjacent insulator blocks comprise a Magnetic Tunnel Junction (MTJ) cell.

13. The device of claim 1, wherein the plurality of levels comprises a first level of MTJ cells and a second level of MTJ cells, the insulator layer of the second level of MTJ cells being provided on a second side of the reference magnetic layer of the first level of MTJ cells, the second side of the reference magnetic layer being opposite the first side.

14. The device of claim 13, wherein each interconnect in the plurality of interconnects formed in the insulator layer of the second level of MTJ cells is coupled to a corresponding section of the conductor layer formed in the trenches within the reference magnetic layer in the second level of the MTJ cells and is further coupled to a corresponding section of the conductor layer formed in the trenches within the reference magnetic layer in the first level of the MTJ cells.

15. The device of claim 13, wherein the plurality of levels further comprises a third level of MTJ cells, the insulator layer of the first level of MTJ cells being provided on the second side of the reference magnetic layer of the third level of MTJ cells.

* * * * *

UNITED STATES PATENT AND TRADEMARK OFFICE
CERTIFICATE OF CORRECTION

| | |
|---|---|
| PATENT NO. | : 11,751,484 B2 |
| APPLICATION NO. | : 17/403733 |
| DATED | : September 5, 2023 |
| INVENTOR(S) | : Satoru Araki |

It is certified that error appears in the above-identified patent and that said Letters Patent is hereby corrected as shown below:

On the Title Page

Item (54) and in the Specification, Column 1, Lines 1-4 should read:
MAGNETIC TUNNEL JUNCTION DEVICES INCLUDING A FREE MAGNETIC TRENCH LAYER AND A PLANAR REFERENCE MAGNETIC LAYER Signed and Sealed this
Seventh Day of November, 2023

Katherine Kelly Vidal
*Director of the United States Patent and Trademark Office*